United States Patent

Agata et al.

[11] Patent Number: 5,546,346
[45] Date of Patent: Aug. 13, 1996

[54] SEMICONDUCTOR MEMORY DEVICE

[75] Inventors: Masashi Agata; Kazuhiro Matsuyama; Hironori Akamatsu; Hirohito Kikukawa; Akihiro Sawada; Shunichi Iwanari, all of Osaka, Japan

[73] Assignee: Matsushita Electric Industrial Co., Ltd., Osaka, Japan

[21] Appl. No.: 354,124

[22] Filed: Dec. 6, 1994

[30] Foreign Application Priority Data

Dec. 6, 1993 [JP] Japan .................................. 5-305328
May 12, 1994 [JP] Japan .................................. 6-098300

[51] Int. Cl.$^6$ .................................................. G11C 7/00
[52] U.S. Cl. ........................ 365/203; 365/233; 365/207
[58] Field of Search .................................. 365/190, 203, 365/207, 208, 233, 195, 196

[56] References Cited

U.S. PATENT DOCUMENTS 5,313,434  5/1994  Abe .................................. 365/203 X
5,428,574  6/1995  Kuo et al. ......................... 365/203 X

OTHER PUBLICATIONS

T. Takai et al., 250Mbyte/sec Synchronous DRAM Using a 3-Stage-Pipelined Architecture, 1993 Symposium on VLSI Circuits, pp. 59–60.

Y. Choi et al., 16Mbit Synchronous DRAM with 125Mbyte/sec Data Rate, 1993 Symposium on VLSI Circuits, pp. 65–66.

H. Yamauchi et al., A Circuit Technology for High-Speed Battery-Operated 16-Mb CMOS DRAM's. IEEE Journal of Solid-State Circuits, vol. 28, No. 11, pp. 1084–1091, Nov. 1993.

*Primary Examiner*—Joseph A. Popek
*Attorney, Agent, or Firm*—McDermott, Will & Emery

[57] ABSTRACT

In a synchronous DRAM required to be capable of performing high-speed consecutive operations in synchronism with a clock signal, a DBI-line pair is connected between a DQ-line pair and an RDB-line pair, and pipeline operation whose single cycle time is divided into four periods is employed. This S-DRAM has following: a first precharge circuit for precharging or voltage-equalizing the DQ-line pair to a power supply voltage level in the first and forth periods only; a second precharge circuit for voltage-equalizing the DBI-line pair to a ground voltage level in the first and second periods only; a third precharge circuit for voltage-equalizing the RDB-line pair to the power supply voltage level in the first and second periods only; first and second differential amplifiers for transmitting data on the DQ lines onto the DBI lines in the third period and for holding the data on the DBI lines in the fourth period; and a third differential amplifier which transmits the data on the DBI lines onto the RDB lines in the third period and which holds the data on the RDB lines in the fourth period.

28 Claims, 19 Drawing Sheets

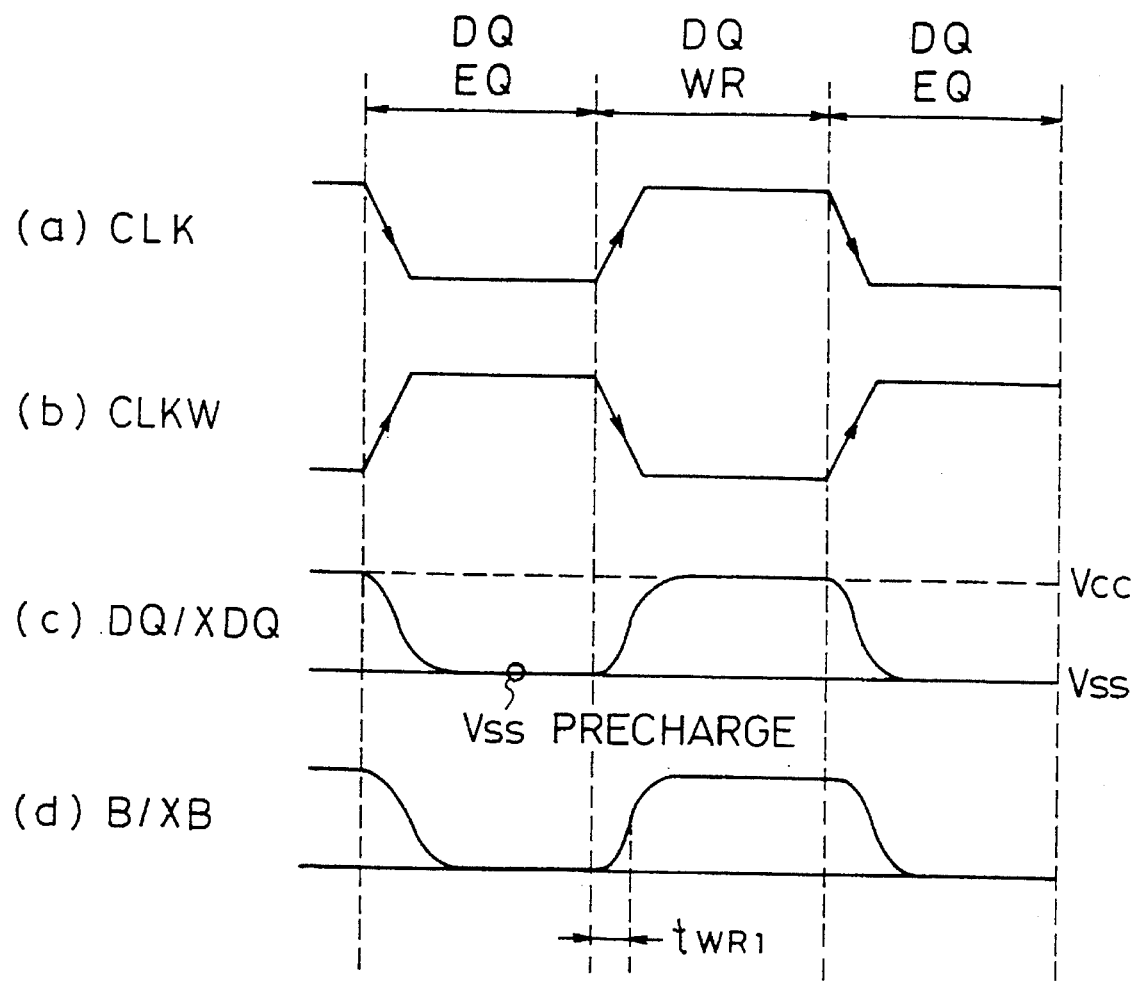

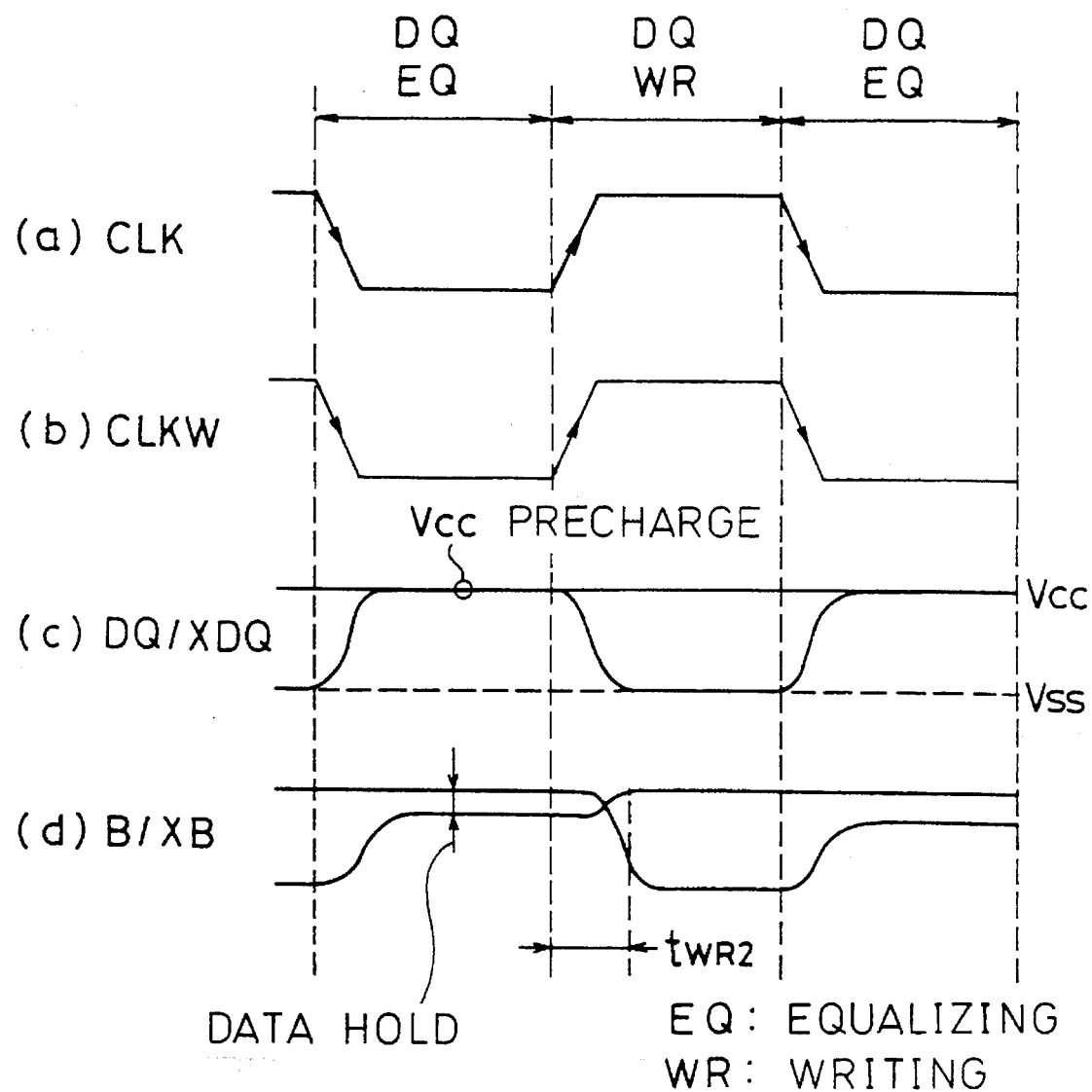

5,546,346

SEMICONDUCTOR MEMORY DEVICE

BACKGROUND OF THE INVENTION

This invention generally relates to data transmission. More particularly, the present invention pertains to an architecture capable of increasing the rate of data transmission within a semiconductor memory device by making use of complementary signal lines.

High-speed differential data transmission (DDT) is a key to the realization of high-performance semiconductor integrated circuits. A high-speed and low-power DDT circuit for general-purpose DRAM is shown by H. Yamauchi et al., in a paper entitled "A Circuit Technology for High-Speed Battery-Operated 16-Mb CMOS DRAM's," IEEE Journal of Solid-State Circuits, Vol. 28, No. 11, pp. 1084–1091, Nov., 1993. This technique is implemented by using a quasi-static N&PMOS cross-coupled amplifier (NPCA) unsubject to a voltage-dependant timing circuit. Data, read onto a pair of complementary data lines from a memory cell via a sense amplifier and via a column switch, are differential-amplified by the NPCA having the ability of performing high-speed and lower-power operations. Then, the data are transmitted to an output circuit through a data read bus made up of a pair of complementary signal lines and are provided outside. Note that, in the following description, a pair of complementary signal lines used for data transmission from a memory cell to a data read amplifier are called DQ/XDQ and a pair of complementary signal lines forming a data read bus used for data transmission from the data read amplifier to an output circuit are called RDB/XRDB.

The NPCA has the following: a pair of internal complementary data lines (DBI/XDBI) connected between DQ/XDQ and RDB/XRDB; first to third precharge circuits for precharging or voltage-equalizing, on the data read time, DQ/XDQ, DBI/XDBI, and RDB/XRDB to the $V_{CC}$ (power supply) level, to the $V_{SS}$ (ground) level, and to the $V_{CC}$ level, respectively; a first differential amplifier connected between DQ/XDQ and DBI/XDBI; and a second differential amplifier connected between DBI/XDBI and RDB/XRDB. In the first differential amplifier, a pair of P-channel MOS (PMOS) transistors with their gates connected to DQ/XDQ respectively are provided on the input side of an NMOS cross-coupled amplifier (i.e., a latch circuit) formed by a pair of N-channel MOS (NMOS) transistors. On the other hand, in the second differential amplifier, a pair of NMOS transistors with their gates connected to DBI/XDBI respectively are provided on the input side of a PMOS cross-coupled amplifier (i.e., a latch circuit) formed by a pair of PMOS transistors.

In such an NPCA as a data read amplifier, a single read cycle time is divided into two periods, the first period and the second period. In the first period, the first to third precharge circuits are simultaneously made active so as to voltage-equalize DQ/XDQ, DBI/XDBI, and RDB/XRDB. In the second period, the first to third precharge circuits are made inactive, thereby allowing the first and second differential circuits to start operating. As a result, read data from the sense amplifier is fed onto DQ/XDQ that is, DQ/XDQ are sensed. The data on DQ/XDQ are transmitted to RDB/XRDB via DBI/XDBI, that is, RDB/XRDB are sensed.

FIG. 14 schematically shows the above-described data read operation. In the first period, the voltage equalization of DQ/XDQ and the voltage equalization of RDB/XRDB are carried out. In the second period, the sensing of DQ/XDQ is carried out and thereafter the sensing of RDB/XRDB is carried out. If (1) the wiring capacitance of DQ/XDQ is about 0.5 pF, (2) the wiring resistance of DQ/XDQ is about 200 Ω, (3) the wiring capacitance of RDB/XRDB is about 2 pF, and (4) the wiring resistance of RDB/XRDB is about 500 Ω, then, for exact differential data transmission to be performed, a minimum of 4 nanoseconds is a required length of time to complete a series of operations from the sensing of DQ/XDQ to the sensing of RDB/XRDB, since the DQ/XDQ sensing requires 2.5 nanoseconds and the RDB/XRDB sensing requires 1.5 nanoseconds. If a length of time taken to voltage-equalize DQ/XDQ and RDB/XRDB is 2.5 nanoseconds, a single cycle time of the DRAM can be reduced down to 6.5 nanoseconds by making use of the foregoing N&PMOS cross-coupled amplifier as a data read amplifier. In other words, a general-purpose DRAM with a maximum operating frequency of 150 MHz can be realized.

Meanwhile, such semiconductor memory devices as synchronous memories and image memories are required to continuously operate in synchronism with a clock signal at high speed. For example, a synchronous DRAM (S-DRAM) is required to be capable of consecutive data read operation in synchronism with a clock signal with a frequency of about 200 MHz, and of consecutive data write operation in synchronism with the clock signal.

A 3.3 V S-DRAM responsive to a clock signal having a frequency of 125 MHz is shown by Y. Choi and the others in a paper entitled "16-Mbit Synchronous DRAM with 125-Mbyte/sec Data Rate," 1993 Symposium on VLSI Circuits, pp. 65–66. An S-DRAM which is similar in performance to the Choi S-DRAM is shown by Y. Takai and the others in a paper entitled "250-Mbyte/sec Synchronous DRAM Using a 3-Stage-Pipelined Architecture," 1993 Symposium on VLSI Circuits, pp. 59–60.

A case where an NPCA structure is applied to a data read amplifier is explained. If the DDT process is kept in a standby state with DQ/XDQ and RDB/XRDB voltage-equalized, this makes it possible to permit fast response with respect to a particular column address strobe signal (CAS). A length of time taken for the response is only about 4 nanoseconds (see FIG. 14). Until the next CAS signal is received, the DDT process is kept in a standby state with DQ/XDQ and RDB/XRDB again voltage-equalized. Therefore, 150 MHz has been sufficient as a maximum operating frequency for the general-purpose DRAM.

However, for the case of the S-DRAM, a 2.5-ns equalizing period is required every time a read operation is executed (see FIG. 14). This is an obstacle to the realization of a target operating frequency. To solve this problem, the above-described S-DRAM, proposed by Y. Choi et al, employs a prefetch structure capable of simultaneously reading 2-bit data with respect to a single column address, so as to apparently accomplish a twofold operating frequency. However, the Choi S-DRAM requires the provision of a multiplexer/selector between a memory array and an external interface, thereby producing the problem that neither the burst length nor the initial address cannot be dealt with easily if they are odd.

FIG. 22a shows the structure of a conventional column decoder used in the Takai S-DRAM. In the figure, NAND circuit 401 for decoding a column address, switch 402 formed by an NMOS transistor, and inverters 403 and 404 together forming a single latch circuit are shown. CLK represents a clock signal and Y represents a column-select line. CLK is applied to the gate of the NMOS transistor forming switch 402 connected between NAND circuit 401 and inverters 403 and 404. The latch circuit, made up of inverters 403 and 404, is operable to hold a signal on a column-select line Y. Such a signal held on the column-select line Y is a signal for on-off controlling a column switch.

If the column-select line Y of FIG. 22a is in an inactive state, then a node A is HIGH and the column-select line Y is LOW. If the output of NAND circuit 401 becomes LOW in accordance with the result of the decode operation of column addresses, and if switch 402 turns on in response to the rising edge of CLK, then the node A makes a transition from HIGH to LOW (HIGH-to-LOW transition) and the column-select line Y makes a transition from LOW to HIGH (LOW-to-HIGH transition). As a result, the column-select line Y is activated. However, there occurs an interference between a low-level output signal of NAND circuit 401 and a high-level signal of the node A.

FIG. 22b is a signal waveform diagram showing the process of activation of Y of FIG. 22a. As illustrated in FIG. 22b, around 2.5 nanoseconds are taken from the moment CLK rises to the moment the column-select line Y is activated, at a 3.3 V power supply. To sum up, in a column decoder employing the FIG. 22a latch circuit, due to the foregoing signal interference, the node A makes a transition with a delay. Then the rising of the column-select line Y is delayed. Finally, the read operation of S-DRAM is delayed.

Once the column-select line Y is made active in response to the rising-edge of CLK, the column-select line Y is held active by the operation of the latch circuit, even after CLK falls. Such an activated state is cancelled by the output of NAND circuit 401 on the next rising-edge of CLK. In other words, conventionally, only transitions, accompanied with the rising of CLK, are utilized. A column-select line that has been made active last during the course of the operation of read is forced to go back to an inactive state (i.e., LOW) by a reset circuit. The reason for this is that, if any one of the column-select lines is continuously held active, then a change in the state of DQ/XDQ is transmitted to bit lines to result in data destruction.

SUMMARY OF THE INVENTION

It is an object of the present invention to provide fast access to data stored in semiconductor memory devices including S-DRAMs having to continuously operate in synchronism with a clock signal at a high speed.

The present invention, with a view to achieving such an object, provides an improved semiconductor memory device. This semiconductor memory device has an improved NPCA in which the voltage equalizing period of RDB/XRDB is period-shifted with respect to the voltage equalizing period of DQ/XDQ. More specifically, this semiconductor memory device employs pipeline operation whose single cycle time for differential data transmission consists of four periods. In the first period, DQ/XDQ and RDB/XRDB are voltage-equalized individually and simultaneously. In the second period, while keeping performing voltage equalizing operation on RDB/XRDB only, DQ/XDQ start receiving data. In the third period, connections are established between DQ/XDQ and RDB/XRDB, whereby data on DQ/XDQ travel onto RDB/XRDB. In the last period, while holding the data on RDB/XRDB, communication between DQ/XDQ and RDB/XRDB is cut off and only DQ/XDQ are voltage-equalized.

In accordance with the above-describe semiconductor memory device, DQ/XDQ are subjected to a voltage equalization operation in the fourth period as well as in the first period, and RDB/XRDB are voltage-equalized in the first and second periods. It is sufficient that RDB/XRDB are voltage-equalized just before data on DQ/XDQ are determined. Therefore, the voltage equalization of RDB/XRDB commences with a delay with respect to the voltage equalization of DQ/XDQ. In the second period, sensing is carried out to DQ/XDQ while RDB/XRDB keep being voltage-equalized. The third period is a period to ensure positive data transmission from DQ/XDQ to RDB/XRDB. Once the potential difference between RDB and XRDB starts becoming greater, there is no need to keep sensing DQ/XDQ. Therefore, upon determination of data on RDB/XRDB, a voltage equalization operation to DQ/XDQ starts at the fourth period.

To sum up, the sensing of DQ/XDQ is performed in part concurrently with the voltage equalization of RDB/XRDB, and the sensing of RDB/XRDB is performed in part concurrently with the voltage equalization of DQ/XDQ. As a result of such an arrangement, it is possible to reduce the single cycle time for differential data transmission and to secure time taken to complete a series of operations from the sensing of DQ/XDQ to the sensing of RDB/XRDB for exact data transmission. Therefore, the present invention provides an S-DRAM with the ability of operating continuously at high speed in synchronism with a clock signal.

The present invention provides another improved semiconductor memory device. This semiconductor memory device has a switching means arranged on a signal path between a sense amplifier and a data read amplifier. This switching means is responsive to a signal representing a logical product of a signal for on-off controlling the switching means and a clock signal, so that the switching means turns on in synchronism with one of recurring rise and fall transitions of the clock signal and turns off in synchronism with the other transition.

The above-described arrangement presents some advantages. For example, unlike conventional techniques, interference between signals can be avoided. It is possible for the switching means to make a quick change to the on-state. This therefore increases the speed of consecutive read operation in synchronism with a clock signal.

BRIEF DESCRIPTION OF THE DRAWING

FIG. 9(a–d) is a signal waveform diagram showing the operation of data write in FIG. 1 S-DRAM.

FIG. 11(a–d) is a signal waveform diagram in relation to a first revision employing the $V_{CC}$ precharge on data write time and are similar to FIGS. 9a–9d.

DETAILED DESCRIPTION OF THE INVENTION

Preferred embodiments of the present invention will now be explained below by reference to the drawings.

EXAMPLE 1

Figure 1:
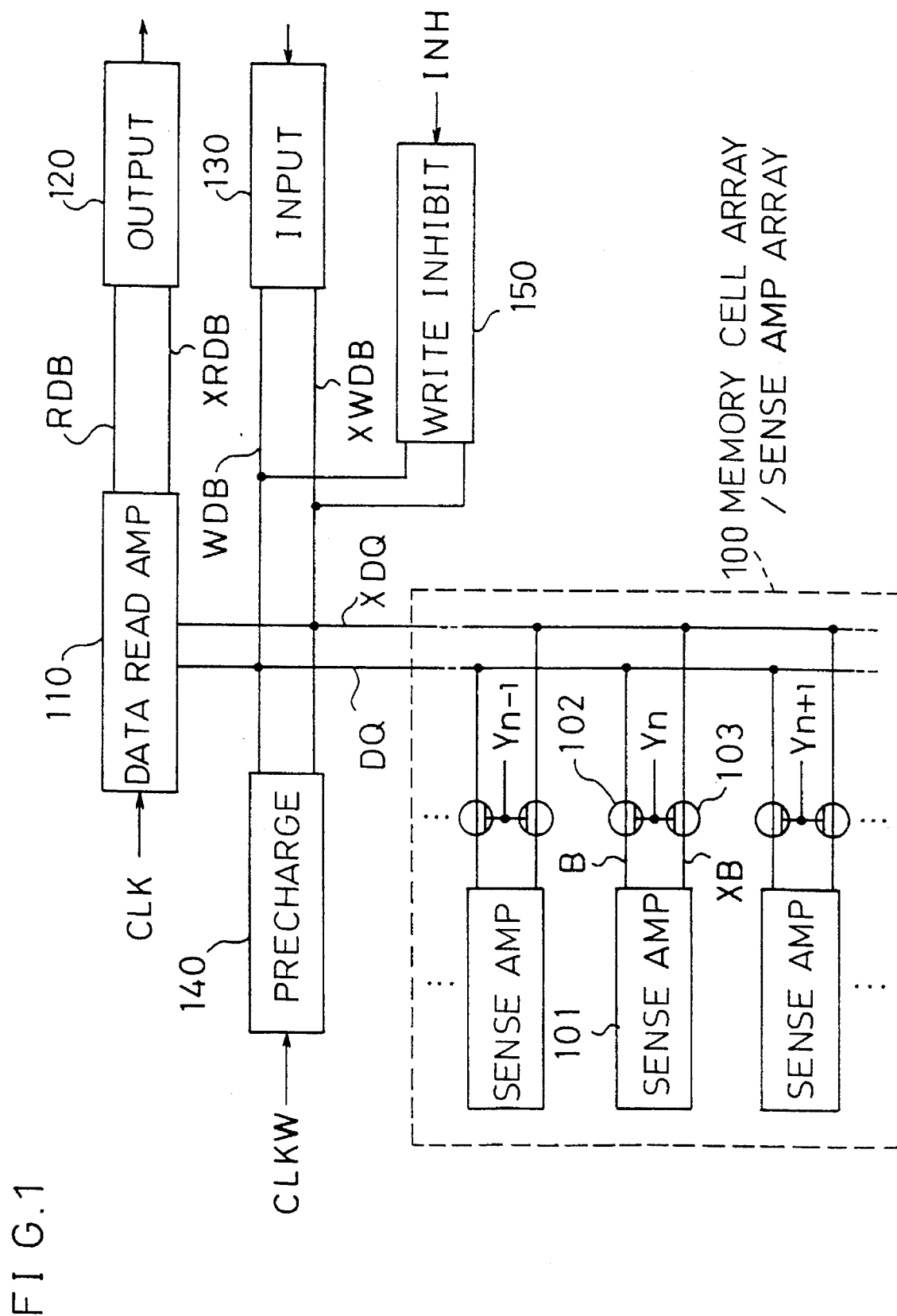
FIG. 1 is a block diagram showing an S-DRAM according to a first embodiment of the present invention.

FIG. 1 is for a 16-Mb S-DRAM but showing only a part thereof, namely a 4-Mb memory cell array block.

This 16-Mb S-DRAM has the following: a 4-Mb memory cell array/sense amplifier array (MSA) 100, a data read amplifier (DRA) 110, an output circuit 120, an input circuit 130, a precharge circuit 140 that is operable on data write time, and a write inhibit circuit (WIC) 150 for accomplishing a so-called DQ mask. CLK of FIG. 1 is a common clock signal for synchronization.

One row of MSA 100 has a sense amplifier 101 and a pair of column switches 102 and 103. Sense amplifier 101 incorporates thereinto a cross-coupled amplifier (i.e., a latch circuit) formed by a pair of NMOS transistors and a pair of PMOS transistors associated with a memory cell array (not shown in the figure). A pair of bit lines (i.e., a pair of complementary signal lines), B/XB, extend from two internal nodes of this latch circuit. B/XB are connected, via column switches 102 and 103, to a pair of complementary signal lines, DQ/XDQ. The gates of the NMOS transistors forming column switches 102 and 103 are connected to a column-select line Yn. Each column-select line Yk (k=..., n−1, n, n+1, ... ) is made active one after another in synchronism with a common clock signal (CLK) in order that synchronization is accomplished. MSA 100 is designed as follows. By reading data out of the latch circuit of sense amplifier 101 via B/XB and via DQ/XDQ, it becomes possible to read data from a target memory cell. By writing data into the latch circuit of sense amplifier 101 via DQ/XDQ and via B/XB, it becomes possible to write data into a target memory cell.

DQ/XDQ, extending from MSA 100, are connected to DRA 110. The output of DRA 110 is transmitted to output circuit 120 via a data read bus made up of a pair-of complementary signal lines, RDB/XRDB and is provided outside.

Data to be written into a memory cell is fed to input circuit 130 from the outside. In response, input circuit 130 transmits the received data onto DQ/XDQ via a data write bus made up of a pair of complementary signal lines, WDB/XWDB. Precharge circuit 140 is operable, in response to a precharge control signal (CLKW) generated from a common clock signal (CLK), so as to precharge or voltage-equalize DQ/XDQ to the $V_{SS}$ level on the data write time. WIC 150 is operable in response to a write inhibit signal (INH) so as to set WDB/XWDB to the $V_{CC}$ level.

Figure 2:
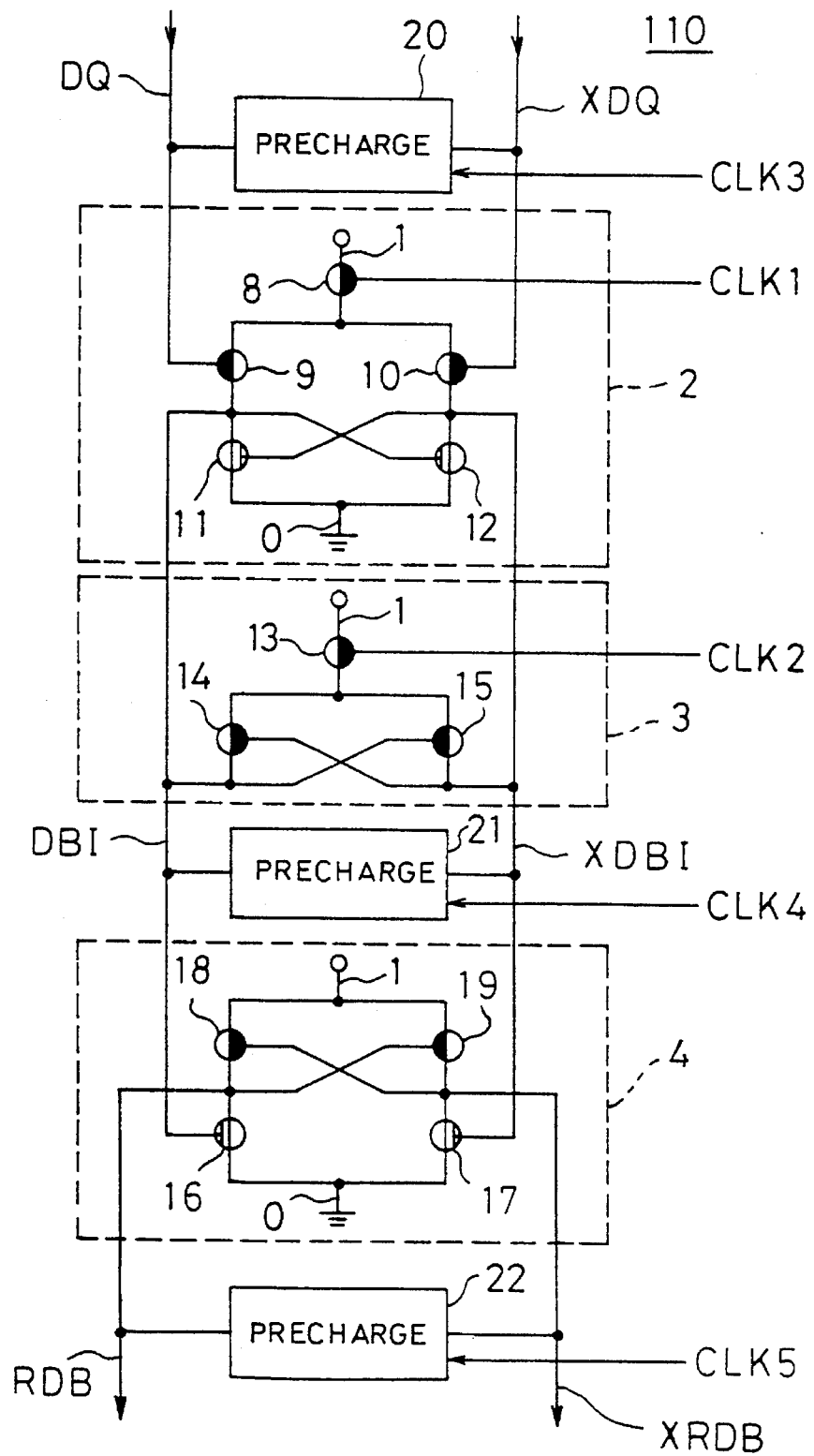
FIG. 2 is a circuit diagram showing a DDT circuit forming a data read amplifier of FIG. 1.

By making reference to FIG. 2, a DDT circuit forming DRA 110 is described. This circuit has the following: DBI/XDBI which are made up of a pair of internal complementary data lines and which are provided between DQ/XDQ and RDB/XRDB, a first precharge circuit 20 for precharging or voltage-equalizing DQ/XDQ on data read time, a second precharge circuit 21 for precharging or voltage-equalizing DBI/XDBI on data read time, a third precharge circuit 22 for precharging or voltage-equalizing RDB/XRDB on data read time, a first differential amplifier 2, a second deferential amplifier 3, and a third differential amplifier 4. Reference numeral 0 indicates a ground terminal having an electric potential of $V_{SS}$ and reference numeral 1 indicates a power supply terminal having an electric potential of $V_{CC}$. CEK1–CLK5 are first to fifth clock signals generated from a common clock signal (CLK).

First differential amplifier Z has a first PMOS transistor 8, a second PMOS transistor 9, a third PMOS transistor 10, a first NMOS transistor 11, and a second NMOS transistor 12. PMOS transistor 8 has a gate and a source, the gate receiving CLK1 and the source being connected to power supply terminal 1. PMOS transistor 9 has a gate, a source, and a drain, the gate being connected to DQ, the source being connected to a drain of PMOS transistor 8, and the drain being connected to DBI. PMOS transistor 10 has a gate, a source, and a drain, the gate being connected to XDQ, the source being connected to the drain of PMOS transistor 8, and the drain being connected to XDBI. The connection of NMOS transistor 11 and the connection of NMOS transistor 12 are established in such a way as to constitute a latch circuit capable of lowering one of DBI/XDBI down to the $V_{SS}$ level and of maintaining such a lowered voltage. More specifically, NMOS transistor 11 (NMOS transistor 12) has a gate, a source, and a drain, the gate being connected to XDBI (to DBI in the case of NMOS transistor 12), the source being connected to ground terminal 0, and the drain being connected to DBI (to XDBI in the case of NMOS transistor 12).

Second differential amplifier 3 has a fourth PMOS transistor 13, a fifth PMOS transistor 14, and a sixth PMOS transistor 15. PMOS transistor 13 has a gate and a source, the gate receiving CLK2 and the source being connected to power supply terminal 1. The connection of PMOS transistor 14 and the connection of PMOS transistor 15 are established in such a way as to constitute a latch circuit capable of increasing one of DBI/XDBI up to the $V_{CC}$ level and of maintaining such an increased voltage. More specifically, PMOS transistor 14 (PMOS transistor 15) has a gate, a source, and a drain, the gate being connected to XDBI (to DBI in the case of PMOS transistor 15), the source being connected to a drain of PMOS transistor 13, and the drain being connected to DBI (to XDBI in the case of PMOS transistor 15).

Third differential amplifier 4 has a third NMOS transistor 16, a fourth NMOS transistor 17, a seventh PMOS transistor 18, and an eighth PMOS transistor 19. The connection of NMOS transistor 16 and the connection of NMOS transistor 17 are established in such a way as to constitute a latch circuit capable of lowering one of RDB/XRDB down to the $V_{SS}$ level and of maintaining such a lowered voltage. More specifically, NMOS transistor 16 (NMOS transistor 17) has a gate, a source, and a drain, the gate being connected to DBI (to XDBI in the case of NMOS transistor 17), the source being connected to ground terminal 0, and the drain being connected to RDB (to XRDB in the case of NMOS transistor 17). The connection of PMOS transistor 18 and the connection of PMOS transistor 19 are established in such a way as to constitute a latch circuit capable of increasing one of RDB/XRDB up to the $V_{CC}$ level and of maintaining such an increased voltage. More specifically, PMOS transistor 18 (PMOS transistor 19) has a gate, a source, and a drain, the gate being connected to XRDB (to RDB in the case of PMOS transistor 19), the source being connected to power supply terminal 1, and the drain being connected to RDB (to XRDB in the case of PMOS transistor 19).

Figure 3A:
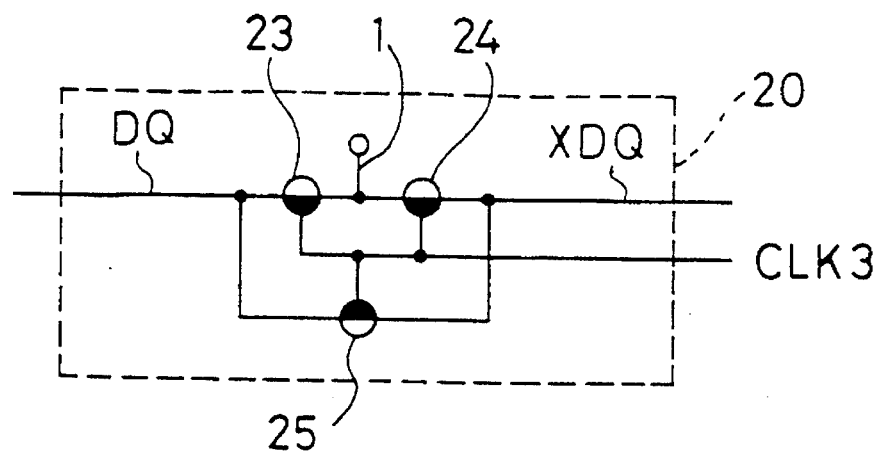
FIGS. 3a–3c are circuit diagrams showing three different precharge circuits of FIG. 2.
Figure 3B:
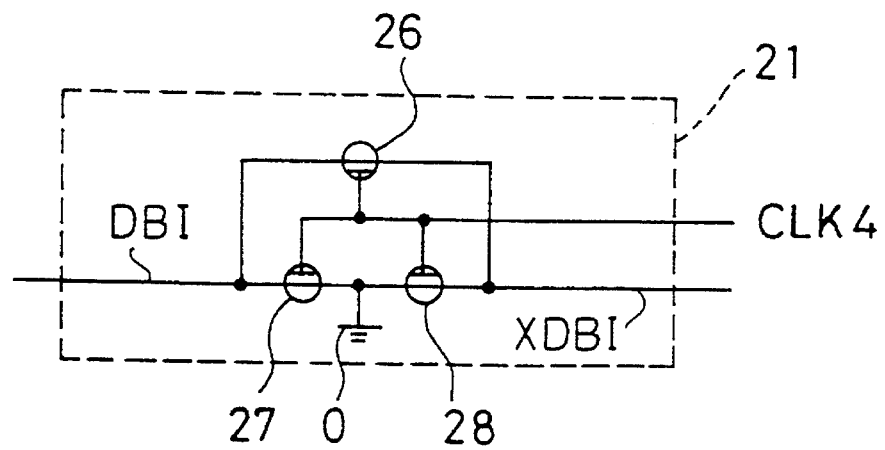
Figure 3C:
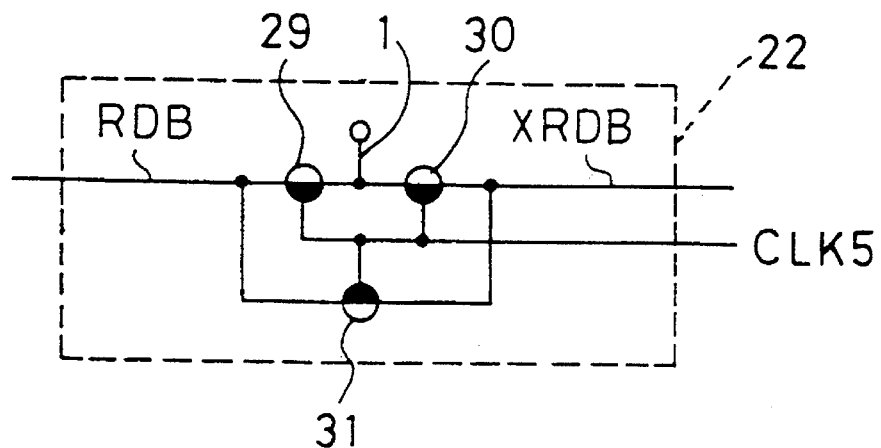

FIGS. 3a–3c show first to third precharge circuits 20, 21, and 22, respectively. Precharge circuit 20 is operable in response to CLK3 in order to precharge or voltage-equalize both DQ/XDQ to the $V_{CC}$ level on data read time. Precharge circuit 20 is formed by PMOS transistor 23, PMOS transistor 24, and PMOS transistor 25 with respective gates for receiving CLK3. Precharge circuit 21 is operable in response to CLK4 in order to precharge or voltage-equalize both DBI/XDBI to the $V_{SS}$ level on data read time. Precharge circuit 21 is formed by NMOS transistor 26, NMOS transistor 27, and NMOS transistor 28 with respective gates for receiving CLK4. Precharge circuit 22 is operable in response to CLK5 in order to precharge or voltage-equalize both RDB/XRDB to the $V_{CC}$ level on data read time. Precharge circuit 22 is formed by PMOS transistor 29, PMOS transistor 30, and PMOS transistor 31 with respective gates for receiving CLK5.

Figure 4:
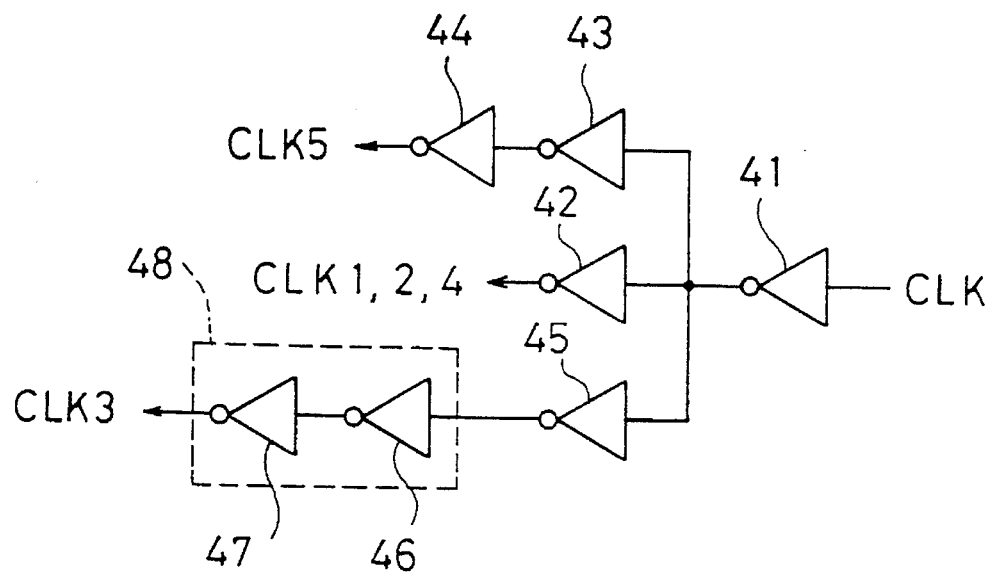
FIG. 4 is a circuit diagram showing a clock generator for generating, from a single common clock signal, five different clock signals to be applied to the FIG. 2 DDT circuit.

FIG. 4 shows the structure of a clock generator capable of generating CLK1 to CLK5 from a single common clock signal (CLK). This clock generator is formed by first to seventh inverters 41–47. CLK1, CLK2, and CLK4 are generated by inverters 41 and 42 in such a way that each of CLK1, CLK2, and CLK4 is in phase with CLK. CLK5 is generated by inverters 41, 43, and 44 in such a way that CLK5 is in reversed phase with CLK. CLK3 is generated by inverters 41, 45, 46, and 47 in such a way that CLK3 is in phase with CLK and is delayed much with respect to CLK1, CLK2, and CLK4. In other words, inverters 46 and 47 together form a delay circuit 48.

Figure 5:
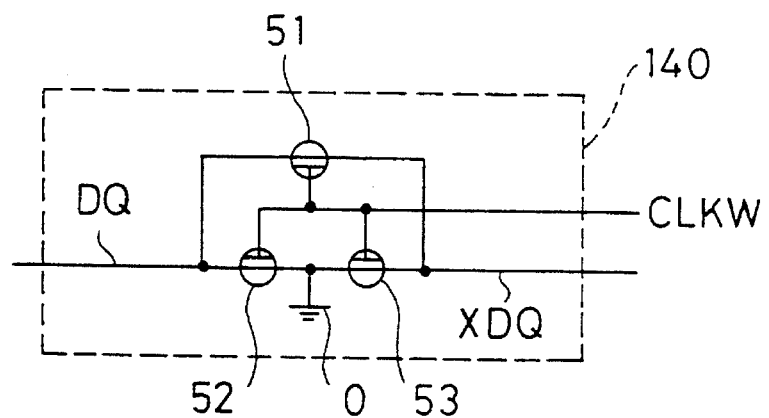
FIG. 5 is a circuit diagram showing a precharge circuit for the operation of data write of FIG. 1.

FIG. 5 shows the internal structure of precharge circuit 140 of FIG. 1 that operates on data write time. This precharge circuit 140 is formed by three NMOS transistors 51, 52, and 53 whose gates receive CLKW to precharge or voltage-equalize both DQ/XDQ to the $V_{SS}$ level on data write time.

Figure 6:
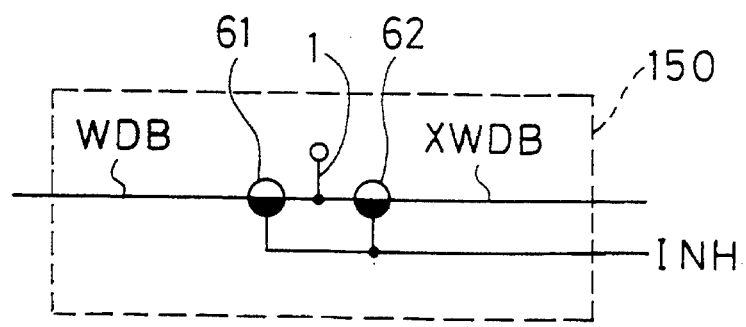
FIG. 6 is a circuit diagram showing a write inhibit circuit of FIG. 1.

FIG. 6 shows the internal structure of WIC 150 of FIG. 1. WIC 150 is formed by two PMOS transistors 61 and 62 whose gates receive INH, in order to set both WDB/XWDB to the $V_{CC}$ level.

5 The operation of data read in an S-DRAM having the above-described structure is explained. FIGS. 7a–7g are signal waveform diagrams showing how DRA 110 of the FIG. 1 S-DRAM, or the FIG. 2 DDT circuit operates. Here, CLKW is held LOW and INH is held HIGH.

Figure 7:
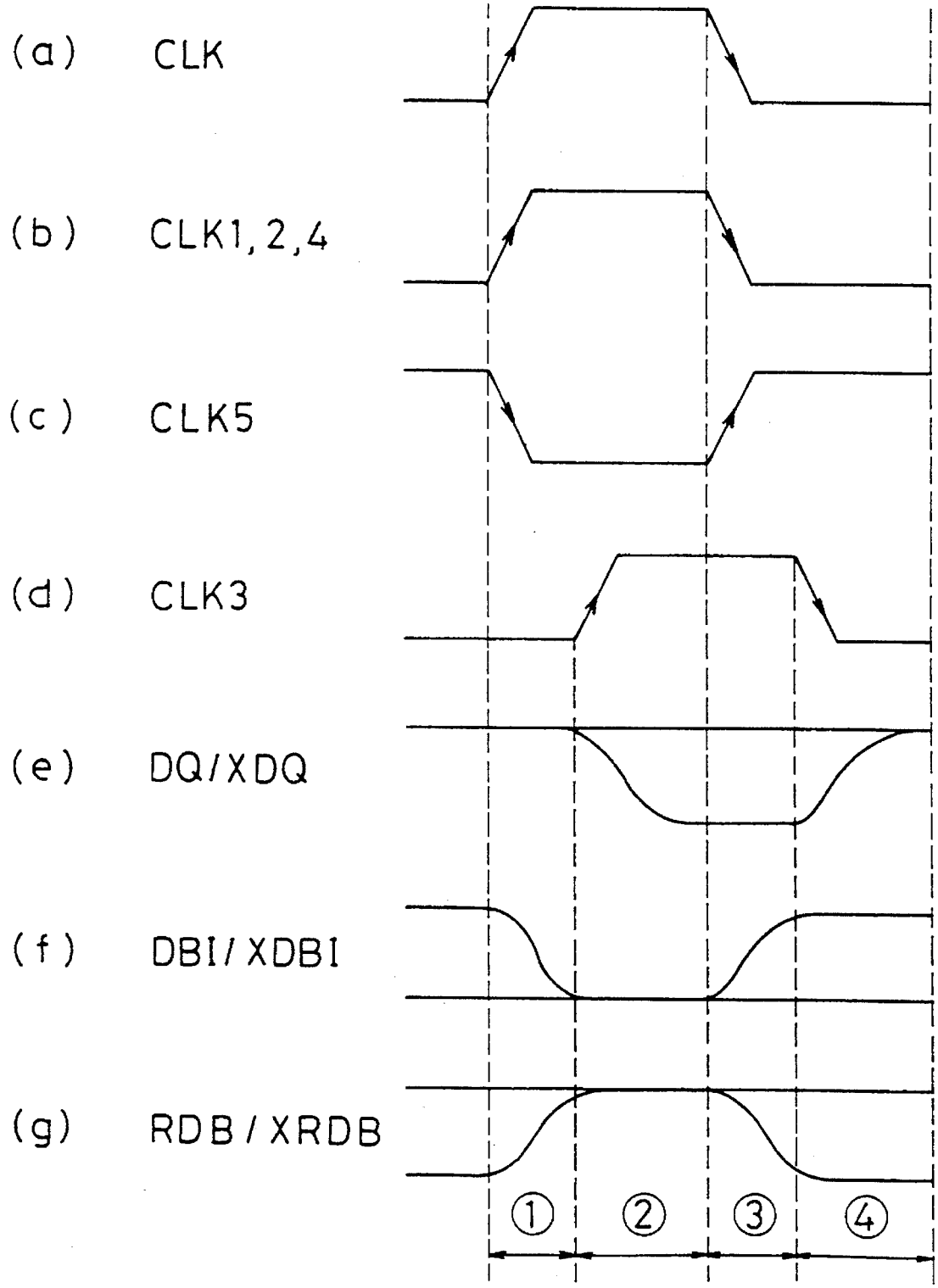
FIG. 7(a–g) is a signal waveform diagram showing the operation of a data read amplifier in FIG. 1 S-DRAM.

One read cycle time is divided into four periods. In the first period, as CLK rises, CLK1, CLK2, and CLK4 each rise and CLK5 falls. Since CLK3 stays LOW, this activates precharge circuit 20. As a result, both DQ/XDQ are precharged or voltage-equalized to the $V_{CC}$ level. At this point in time, both PMOS transistors 9 and 10 turn off. PMOS transistor 8, too, turns off as CLK1 goes HIGH. Then first differential amplifier 2 is made inactive, thereby breaking communication between DQ/XDQ and DBI/XDBI. As CLK4 becomes HIGH, second precharge circuit 21 is made active and both DBI/XDBI are precharged or voltage-equalized to the $V_{SS}$ level. At this stage, NMOS transistors 11, 12, 16, and 17 turn off. PMOS transistor 13 turns off as CLK2 becomes HIGH. Then second differential amplifier 3 goes inactive. Since NMOS transistors 16 and 17 each have turned off, this causes third differential amplifier 4 to go inactive thereby breaking communication between DBI/XDBI and RDB/XRDB. As CLK5 becomes LOW, third precharge circuit 22 goes active thereby precharging or voltage-equalizing both RDB/XRDB to the $V_{CC}$ level. At this point in time, both PMOS transistors 18 and 19 turn off. As described above, each precharge circuit 20, 21, and 22 is made active, with each differential amplifier 2, 3, and 4 made inactive. As a result, as shown in FIGS. 7e–7g, DQ/XDQ, DBI/XDBI, and RDB/XRDB are precharged or voltage-equalized to the $V_{CC}$ level, to the $V_{SS}$ level, and to the $V_{CC}$ level, respectively.

In the second period, neither CLK1, CLK2, CLK4, nor CLK5 but CLK3 makes a transition. As CLK3 goes HIGH, precharge circuit 20 is made inactive. As a result, the precharge of DQ/XDQ stops. Data, read onto DQ/XDQ from sense amplifier 101 via column switches 102 and 103, reach the gates of PMOS transistors 9 and 10. However, CLK1 is held HIGH, so that PMOS transistor 8 keeps turning off. As a result, in first differential amplifier 2, DQ/XDQ and DBI/XDBI continue to be disconnected from each other. As described above, in the second period, the operation of sensing is carried out to DQ/XDQ, with DBI/XDBI and RDB/XRDB precharged or voltage-equalized to the $V_{SS}$ level and to the $V_{CC}$ level, respectively (see FIGS. 7e–7g).

In the third period, in response to the falling-edge of CLK, each of CLK1, CLK2, and CLK4 falls while CLK5 rises. CLK3 is held HIGH. At this point in time, second precharge circuit 21 goes inactive as CLK4 becomes LOW. As a result, the precharge (voltage-equalization) of DBI/XDBI stops. Third precharge circuit 22 goes inactive as CLK5 becomes HIGH. As a result, the precharge (voltage-equalization) of RDB/XRDB stops. Meanwhile, PMOS transistor 8 turns on as CLK1 becomes LOW, and PMOS transistor 13 turns on as CLK2 becomes LOW, whereby both first and second differential amplifiers 2 and 3 are activated. At this point in time, an electric potential, corresponding to the foregoing data which were read from sense amplifier 101 onto DQ/XDQ and which has already reached the gates of PMOS transistors 9 and 10, is created on DBI/XDBI. This created potential is detected, amplified, and latched by NMOS transistors 11 and 12 and PMOS transistors 14 and 15. This immediately determines data on DBI/XDBI. For example, if PMOS transistor 9 has a gate voltage of HIGH and PMOS transistor 10 has a gate voltage of LOW, then this immediately causes the drain voltages of NMOS transistors 11 and 12 to go LOW and HIGH, respectively. At a point when one of DBI/XDBI goes high to such an extent as to exceed the threshold voltage of NMOS transistors 16 and 17, NMOS transistor 16 or NMOS transistor 17, whichever undergoes a rise in the gate voltage, turns on. As a result, third differential amplifier 4 goes active, and a potential difference which corresponds to the one between DBI/XDBI is created between RDB/XRDB. This created potential difference between RDB/XRDB is detected, amplified, and latched by NMOS transistors 16 and 17 and PMOS transistors 18 and 19. This immediately determines data on RDB/XRDB. For example, if the gate voltage of NMOS transistor 17 makes a transition to HIGH, then the drain voltage of NMOS transistor 16 immediately goes HIGH and the drain voltage of NMOS transistor 17 immediately goes LOW. As described above, in the third period, as shown in FIGS. 7e–7g, sensing operation is performed with respect to DQ/XDQ, to DBI/XDBI, and to RDB/XRDB. Data, transmitted onto RDB/XRDB, are provided outside via output circuit 120.

In the last period (i.e., the fourth period), neither CLK1, CLK2, CLK4, nor CLK5 but CLK3 makes a transition. Precharge circuit 20 goes active as CLK3 becomes LOW. As a result, both DQ/XDQ are precharged or voltage-equalized to the $V_{CC}$ level and, both PMOS transistor 9 and PMOS transistor 10 turn off. This breaks communication between DQ/XDQ and DBI/XDBI in first differential circuit 2 even if PMOS transistor 8 stays on. Since NMOS transistors 11 and 12 of first differential amplifier 2, PMOS transistors 14 and 15 of second differential amplifier 3, and NMOS transistors 16 and 17, PMOS transistors 18 and 19 of third differential amplifier 4 continue to perform their respective latching operations, both data on DBI/XDBI and data on RDB/XRDB are maintained. In the fourth period, the precharge (voltage-equalization) of DQ/XDQ is carried out while continuously performing sensing operation on DBI/XDBI as well as on RDB/XRDB (see FIGS. 7e–7g).

Figure 8:
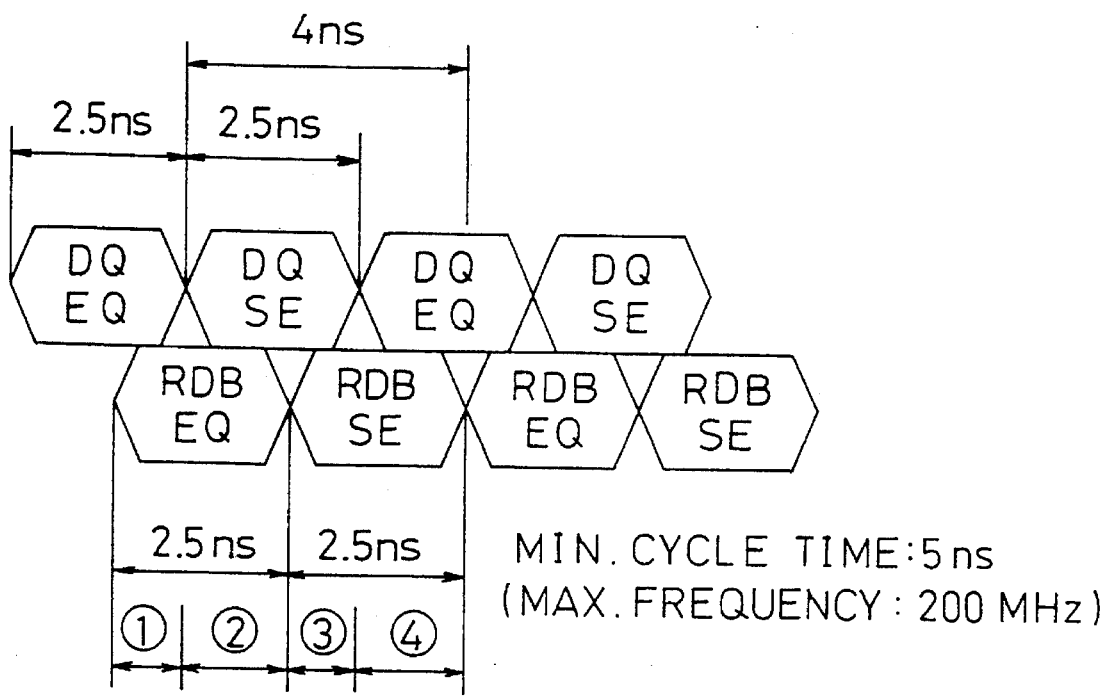
FIG. 8 is a diagram schematically showing the operation of a data read amplifier of the FIG. 1 S-DRAM.

FIG. 8 schematically depicts the above-described data read operation. In the first period, both DQ/XDQ and RDB/XRDB are voltage-equalized. In the second period, RDB/XRDB are voltage-equalized while DQ/XDQ are sensed. In the third period, both DQ/XDQ and RDB/XRDB are sensed. Finally, in the fourth period, RDB/XRDB are sensed while DQ/XDQ are voltage-equalized. In order for sense amplifier 101 to continuously output read data in synchronism with CLK, the application of CLK must be done in such a way as to repeat the above described data read operation composed of the first to fourth periods. If the fourth period is a standby state, this makes it possible to immediately resume data transmission from a state in which DQ/XDQ are voltage-equalized.

Figure 14:
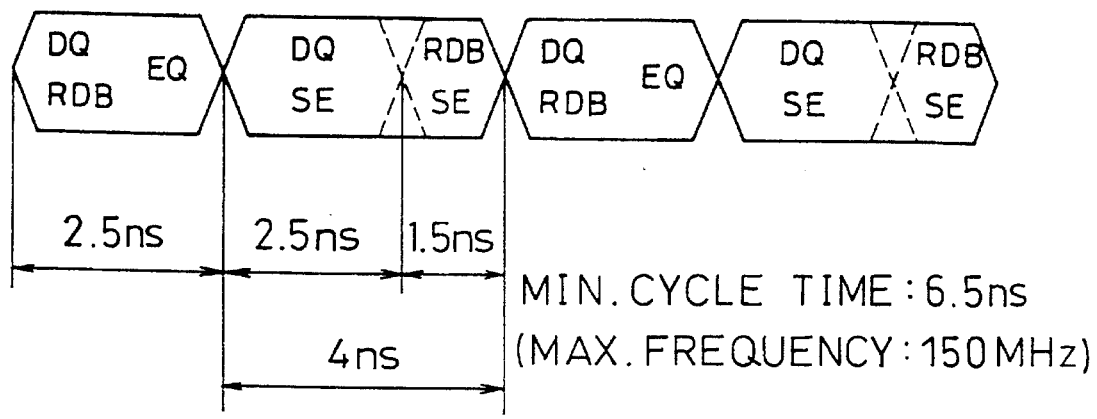
FIG. 14 schematically shows the operation of a data read amplifier of a conventional general-purpose DRAM.

Suppose (1) the wiring capacitance of DQ/XDQ is about 0.5 pF, (2) the wiring resistance of DQ/XDQ is about 200 Ω, (3) the wiring capacitance of RDB/XRDB is about 2 pF, and (4) the wiring resistance of RDB/XRDB is about 500 Ω. Like the conventional technique of FIG. 14, for exact data transmission to be executed, a period of 4 nanoseconds is taken to complete a series of operations from the sensing of DQ/XDQ to the sensing of RDB/XRDB, and it is so arranged that the operation of voltage-equalization and the operation of sensing with respect to DQ/XDQ and RDB/XRDB each take 2.5 nanoseconds. As a result, the cycle time of the S-DRAM of the present embodiment can be reduced to 5 nanoseconds. The present invention therefore provides an S-DRAM with a maximum operating frequency of 200 MHz.

In the present embodiment, CLK3 is deliberately made delayed, by delay circuit 48, in phase with respect to CLK. This creates enough time for data transmission from DQ/XDQ to DBI/XDBI and RDB/XRDB. Therefore, even if there is a variation in the MOS transistor threshold voltage, wrong data transmission can be prevented. In an actual S-DRAM, Yn associated with column switches 102 and 103 will go active with a delay of about 1–2 nanoseconds from the rising-edge of CLK. Under actual conditions, data of sense amplifier 101 reaches, as a sufficient electric potential, DRA 110 via DQ/XDQ 3 to 4 nanoseconds after CLK rises. Therefore, the above-described arrangement (i.e., the first period serves as a voltage-equalizing period for DQ/XDQ, and it is not until the third period comes that the transmission of data from DQ/XDQ to RDB/XRDB starts) is suitable for actual S-DRAMs.

A DDT circuit employing a structure of FIG. 2 is capable of operating through a wide operating frequency range in accordance with the CLK frequency. Therefore, such a DDT circuit is suitable for being used as a data read amplifier for the S-DRAM.

Additionally, in such a DDT circuit, at least one of the MOS transistors, provided along a path from power supply terminal 1 to ground terminal 0, turns off. This arrangement prevents a current from flowing from power supply terminal 1 to ground terminal 0 thereby providing a lower-power amplifier in comparison with a conventional amplifier of a current mirror type. For example, at an operating frequency of 100 MHz, the power consumption is reduced by around 50%.

As described above, with the present DDT circuit, it is possible to provide high-speed performance, to prevent malfunction, and to reduce power consumption.

In MOS semiconductor integrated circuits using a p-type substrate, an NMOS transistor usually has an internal resistance about one-half that of a PMOS transistor. For instance, in a latch circuit of sense amplifier 101, the NMOS transistor's ability of lowering B/XB to the $V_{SS}$ level is around twice as strong as the PMOS transistor's ability of increasing B/XB to the $V_{CC}$ level.

Unlike the present embodiment, if, on the data read time, DQ/XDQ are precharged to the $V_{SS}$ level or to a level close to the $V_{SS}$ level, this gives rise to the problem that data on B/XB are destroyed due to the above-described PMOS transistor's poor performance. When turning on column switches 102 and 103 formed by NMOS transistors, these NMOS transistors undergo perfect short circuiting. As a result, the higher of the voltages of B/XB is lowered to match with the voltage of DQ/XDQ, and data on B/XB are destroyed.

Conversely, in accordance with the present embodiment, even if DQ/XDQ are precharged to the $V_{CC}$ level or to a level close to the $V_{CC}$ level on the data read time, this will not result in destroying data on B/XB. If DQ/XDQ, precharged to the $V_{CC}$ level, are brought into connection with B/XB via column switches 102 and 103, the lower of the voltages of B/XB is increased. However, column switches 102 and 103 are made up of NMOS transistors, so that the lower of the voltages of B/XB increases just up to a level expressed by $(V_{CC}-V_t)$, where $V_t$ is the NMOS transistor threshold voltage. As a result, data on B/XB are held nondestructive.

If one of the voltages of DQ/XDQ both precharged to the $V_{CC}$ level or to a level close to the $V_{CC}$ level is lowered, by one of the NMOS transistors in a latch circuit of sense amplifier 101, down to the $V_{SS}$ level, this offers an effect of speeding up the read rate, since the NMOS transistor's ability of increasing B/XB to the $V_{SS}$ level is stronger than PMOS transistor's ability of increasing B/XB to the $V_{CC}$ level.

Next, the operation of date write is explained. FIGS. 9a–9d are signal waveform diagrams showing the data write operation of the FIG. 1 S-DRAM. Note that precharge circuit 20 of DRA 110 is held inactive by keeping at least CLK3 at HIGH.

One data write cycle time is divided into two periods. In the first period, CLKW rises as CLK falls. Precharge circuit 140 is made active as CLKW becomes HIGH. As a result, both DQ/XDQ are precharged or voltage equalized to the $V_{SS}$ level. B/XB, too, are once equalized, via column switches 102 and 103, to the $V_{SS}$ level. Data destruction occurs to B/XB. However, unlike the foregoing data read, at this point in time, new data is being written into a latch circuit of sense amplifier 101, so that such data destruction can be ignored.

In the second period, CLKW falls as CLK rises. Precharge circuit 140 goes inactive as CLKW becomes LOW. As a result, the precharge (voltage-equalization) of DQ/XDQ stops. At the same time, external write data, supplied from the outside to input circuit 130, is transmitted onto DQ/XDQ via WDB/XWDB. If there is any voltage increase in DQ/XDQ, one of the voltages of B/XB having to be set at the $V_{CC}$ level immediately increases via column switches 102 and 103. This rapidly determines data on B/XB, and the operation of data write to a latch circuit of sense amplifier 101 is carried out.

As described above, in the first period, DQ/XDQ are voltage-equalized to the $V_{SS}$ level. In the second period, high-speed data write is performed by way of DQ/XDQ. Time from the moment CLK rises to the moment data is written into a latch circuit of sense amplifier 101, $t_{WR1}$, is used for comparison with revisions of the present embodiment which will be described later. In order to continuously write data in synchronism with CLK, the provision of CLK must be carried out in such a way as to repeat the first and second periods.

In accordance with the present embodiment, both the operation of data read and the operation of data write are executed at high speed because precharge circuit 20 for precharging or voltage-equalizing DQ/XDQ to the $V_{CC}$ level on data read time is arranged in DRA 110 and precharge circuit 140 for precharging or voltage-equalizing DQ/XDQ to the $V_{SS}$ level on data write time is provided.

During the course of the repetition of data write cycles for writing data into memory cells in synchronism with CLK, if INH is input at a certain cycle (hereinafter called a write inhibit cycle), data, latched by a latch circuit of sense amplifier 101 belonging to a column selected at such a write inhibit cycle, must be held. However, when precharging or voltage-equalizing DQ/XDQ to the $V_{SS}$ level by means of precharge circuit 140 with high performance, this produces the problem that data on B/XB are destroyed on the precharge time. To cope with this problem, INH is made LOW at the write inhibit cycle and write inhibit circuit 150 (see FIG. 6 for its internal structure) is made active, so that both WDB/XWDB are forcefully set at the $V_{CC}$ level. As a result of such arrangement, even if DQ/XDQ are set at the $V_{CC}$ level via WDB/XWDB, this only allows one of B/XB to grow just up to $(V_{CC}-V_t)$ because column switches 102 and 103 are made up of NMOS transistors. Therefore, the data on B/XB are not destroyed but maintained.

Because of the provision of WIC 150, even if precharge circuit 140 tries to precharge or voltage-equalize DQ/XDQ to the $V_{SS}$ level at a write inhibit cycle, or even if input circuit 130 tries to transmit write data onto WDB/XWDB, data on B/XB are maintained. In other words, the present embodiment is capable of performing, at the same time, high-speed write operation and the foregoing write inhibit cycle operation, eliminating needs for providing a special circuit for inhibiting data transmission toward WDB/XWDB in input circuit 130, and for providing a special circuit for inhibiting the column-select line Yn from going active.

Three revisions of the present embodiment for data write operation are now described below. More specifically, (1) the $V_{CC}$ precharge of DQ/XDQ, (2) the weak $V_{SS}$ precharge of DQ/XDQ, and (3) the ½ $V_{CC}$ precharge of DQ/XDQ are explained.

Figure 10A:
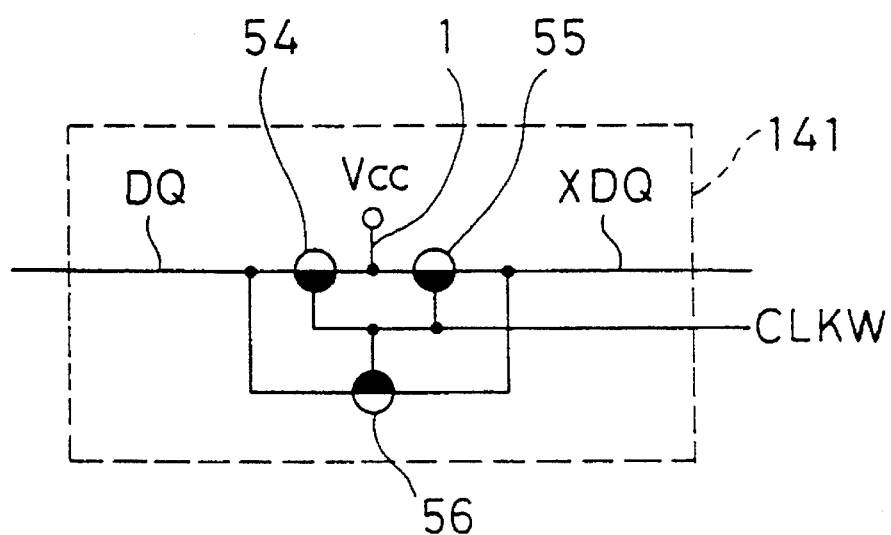
FIGS. 10a–10b are circuit diagram showing revisions of the FIG. 1 precharge circuit for data write.
Figure 10B:
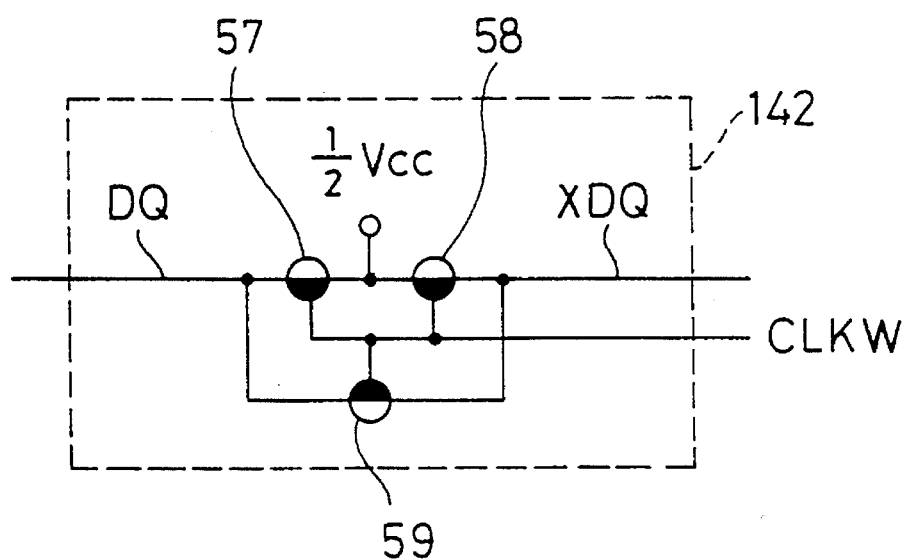

FIGS. 10a and 10b are circuit diagrams showing the revisions of precharge circuit 140 of FIG. 5 for data write operation in terms of FIG. 1.

Precharge circuit 141 of FIG. 10a precharges or voltage-equalizes both DQ/XDQ to the $V_{CC}$ level in response to CLKW on the data write time. This precharge circuit 141 is formed by PMOS transistors 54, 55, and 56 With gates to receive CLKW. Unlike precharge circuit 140 of FIG. 5, precharge circuit 141 goes active as CLKW becomes LOW.

Precharge circuit 142 of FIG. 10b precharges or voltage-equalizes both DQ/XDQ to the ½ $V_{CC}$ level in response to CLKW on the data write time. This precharge circuit 142 is formed by PMOS transistors 57, 58, and 59 with gates to receive CLKW. This precharge circuit 142, too, goes active as CLKW becomes LOW.

REVISION 1

In a first revision, precharge circuit 141 of FIG. 10a is used in place of precharge circuit 140 of FIG. 5. FIGS. 11a–11d are similar diagrams to FIGS. 9a–9d.

In the first revision, one write cycle time is likewise divided into two periods. In the first period, CLKW falls as CLK falls. Precharge circuit 141 goes active as CLKW becomes LOW. As a result, both DQ/XDQ are precharged or voltage-equalized to the $V_{CC}$ level. Even if both DQ/XDQ are equalized to the $V_{CC}$ level, this only allows one of B/XB to grow Just up to $(V_{CC}-V_t)$ because column switches 102 and 103 are formed by NMOS transistors. As a result, data on B/XB are maintained, regardless of whether it is now in a write inhibit cycle or not.

In the second period, CLKW rises as CLK rises. Precharge circuit 141 goes inactive as CLKW becomes HIGH. As a result, the precharge (voltage-equalization) of DQ/XDQ stops. At the same time, external write data fed to input circuit 130 is transmitted onto DQ/XDQ via WDB/XWDB. It is not until the moment one of DQ/XDQ is lowered to a voltage level below $(V_{CC}-V_t)$ that the data on DQ/XDQ start traveling to B/XB. The first revision is slower in the determination of the data on B/XB in comparison with the first embodiment. If time from the moment CLK rises to the moment data is written into a latch circuit of sense amplifier 101 of this revision is $t_{WR2}$, then $t_{WR1}<t_{WR2}$.

In a write inhibit cycle of the second period, data on B/XB are maintained because of the operation of write inhibit circuit 150. If a special circuit for inhibiting data transmission to WDB/XWDB in response to INH is arranged within input circuit 130, this makes it possible to perform write inhibit cycle operations without the provision of write inhibit circuit 150. This is because data destruction does not take place in the case of the $V_{CC}$ precharge.

Additionally, the provision of precharge circuit 141 of FIG. 10a may be omitted, and, instead, precharge circuit 20 of DRA 110 may serve also as a circuit for the $V_{CC}$ precharge on the data write time.

REVISION 2

In a second revision of the first embodiment, the weak $V_{SS}$ precharge of DQ/XDQ is executed on the data write time. For such a precharge operation to be carried out, the following arrangement is made. Compared with PMOS transistors 23 and 24 (see FIG. 3a) of precharge circuit 20 for precharging or voltage-equalizing DQ/XDQ to the $V_{CC}$ level on the data read time, NMOS transistors 52 and 53 (see FIG. 5) of precharge circuit 140 for precharging or voltage-equalizing DQ/XDQ to the $V_{SS}$ level on the data write time have a twofold internal resistance. This weakens the NMOS transistors' 52 and 53 abilities of lowering DQ/XDQ to the $V_{SS}$ level. FIGS. 12a–12d are similar diagrams to FIGS. 9a–9d.

Figure 12:
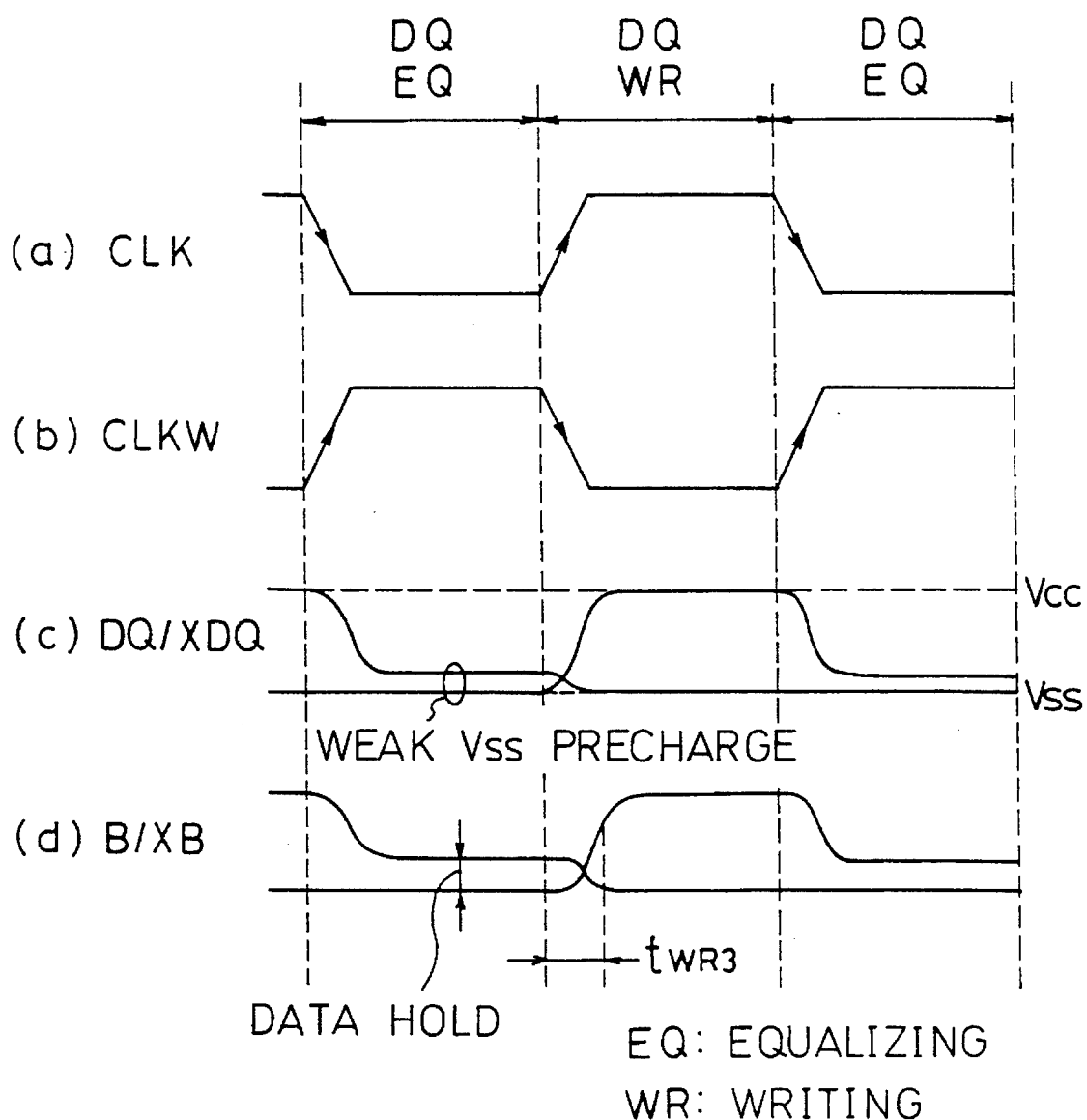
FIG. 12(a–d) is a signal waveform diagram in relation to a second revision employing the weak $V_{SS}$ precharge on data write time and are similar to FIGS. 9a–9d.

In the second revision, one write cycle time is likewise divided into two periods. In the first period, CLKW rises as CLK falls. Precharge circuit 140 goes active as CLKW becomes HIGH. At this point in time, the higher of the voltages of DQ/XDQ will not drop to the $V_{SS}$ level (see FIG. 12c) because of interaction of NMOS transistors 52 and 53 of precharge circuit 140 with PMOS transistors of a latch circuit of sense amplifier 101 (i.e., the weak $V_{SS}$ precharge). The higher of the voltages of B/XB will not drop to the $V_{SS}$ level, as shown in FIG. 12d. As a result, data on B/XB are maintained, regardless of whether it is now in a write inhibit cycle or not.

In the second period, CLKW falls as CLK rises. Precharge circuit 140 goes inactive as CLKW becomes LOW. As a result, the weak $V_{SS}$ precharge (voltage-equalization) of DQ/XDQ stops. At the same time, external write data fed to input circuit 130 is transmitted onto DQ/XDQ via WDB/XWDB. For the case of the present revision, if time from the moment CLK rises to the moment data is written to a latch circuit of sense amplifier 101 is $t_{WR3}$, then $t_{WR1} < t_{WR3} < t_{WR2}$. Therefore, it is possible to provide an appropriate write rate that is slightly slower than that of the first embodiment but much faster than that of the first revision.

In a write inhibit cycle of the second period, data on B/XB are maintained because of the operation of write inhibit circuit 150. If a special circuit for inhibiting data transmission to WDB/XWDB in response to INH is arranged within input circuit 130, this makes it possible to perform write inhibit cycle operations without the provision of write inhibit circuit 150. This is because data destruction does not take place in the case of the weak $V_{SS}$ precharge.

Preferably, the internal resistance of PMOS transistors 23 and 24 (see FIG. 3a) for the $V_{CC}$ precharge of DQ/XDQ on the data read time is appropriately reduced to such an extent that a further reduction provides no faster precharge rates. If the PMOS internal resistance is excessively lowered, this produces the disadvantage that transistors require more areas. On the other hand, the internal resistance of NMOS transistors 52 and 53 (see FIG. 5) for the weak $V_{SS}$ precharge of DQ/XDQ on the data write time is set more than twice as high as the internal resistance (i.e., the minimum resistance value) of PMOS transistors 23 and 24.

REVISION 3

In a third revision of the first embodiment, precharge circuit 142 of FIG. 10b is used in place of precharge circuit 140 of FIG. 5. FIGS. 13a–13d are similar diagrams to FIGS. 9a–9d.

Figure 13:
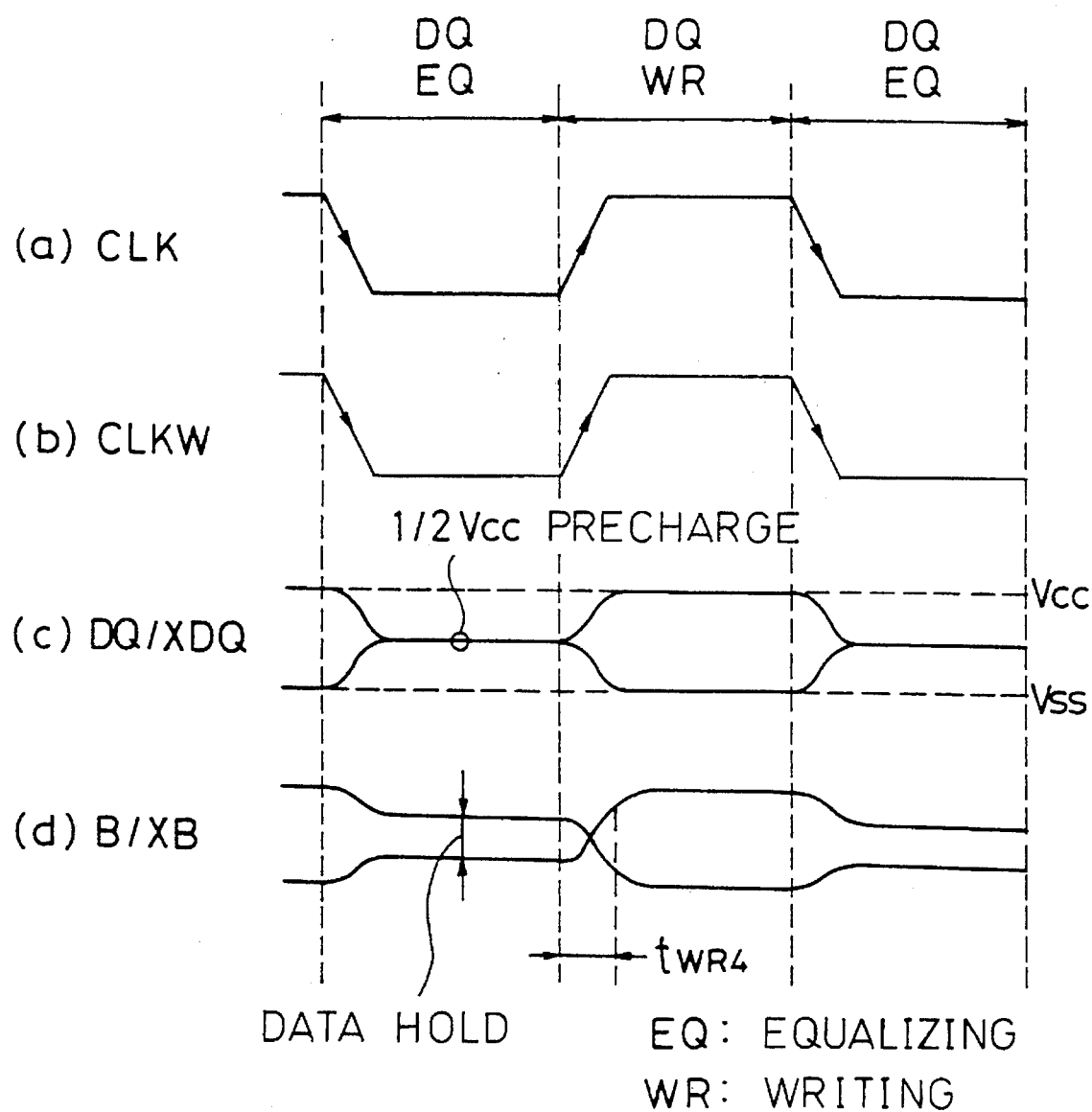
FIG. 13(a–d) is a signal waveform diagram in relation to a third revision employing the ½ $V_{CC}$ precharge on data write time and are similar to FIGS. 9a–9ad.

In the third revision, one write cycle time is likewise divided into two periods. In the first period, CLKW falls as CLK falls. Precharge circuit 142 goes active as CLKW becomes LOW. As a result, both DQ/XDQ are precharged or voltage-equalized to the ½ $V_{CC}$ level. Since the gate-to-source voltage of NMOS transistors forming column switches 102 and 103 is as low as ½ $V_{CC}$, their internal resistance increases. Therefore, as shown in FIG. 13d, the higher of the voltages of B/XB will not drop to the ½ $V_{CC}$ level, while on the other hand the lower of the voltages of B/XB will not go up to the ½ $V_{CC}$ level. As a result, data on B/XB are maintained, regardless of whether it is now in a write inhibit cycle or not.

In the second period, CLKW rises as CLK rises. Precharge circuit 142 goes inactive as CLKW becomes HIGH. As a result, the ½ $V_{CC}$ precharge (voltage-equalization) of DQ/XDQ stops. At the same time, external write data fed to input circuit 130 is transmitted onto DQ/XDQ via WDB/XWDB. For the case of the present revision, if time from the moment CLK rises to the moment data is written to a latch circuit of sense amplifier 101 is $t_{WR4}$, then $t_{WR1} < t_{WR4} < t_{WR2}$. Therefore, it is possible to provide an appropriate write rate that is slightly slower than that of the first embodiment but much faster than that of the first revision.

In a write inhibit cycle of the second period, data on B/XB are maintained because of the operation of write inhibit circuit 150. If a special circuit for inhibiting data transmission to WDB/XWDB in response to INH is arranged within input circuit 130, this makes it possible to perform write inhibit cycle operations without the provision of write inhibit circuit 150. This is because data destruction does not take place in the case of the ½ $V_{CC}$ precharge.

If precharge circuit 20 in DRA 110 for the $V_{CC}$ precharge of DQ/XDQ on the data read time is changed to a circuit used for the ½ $V_{CC}$ precharge, this makes it possible to omit the provision of precharge circuit 142 of FIG. 10b and to make precharge circuit 20 serve also as a circuit for the ½ $V_{CC}$ precharge on the data write time.

The foregoing descriptions have been made in terms of the S-DRAM. However, DDT circuits of a FIG. 2 type are applicable in other semiconductor memory devices.

EXAMPLE 2

Figure 15:
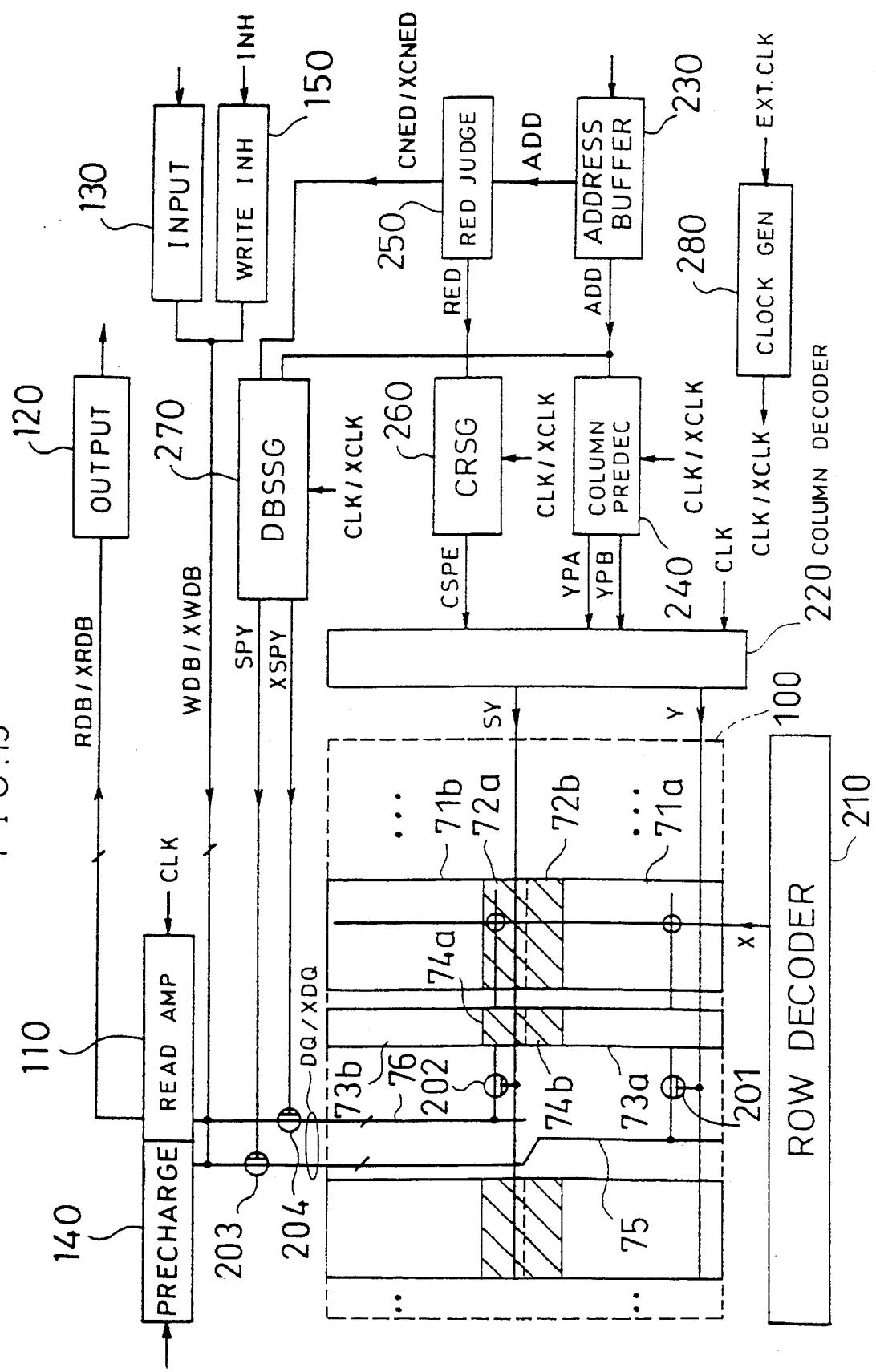
FIG. 15 is a block diagram depicting an S-DRAM of a second embodiment of the present invention.

FIG. 15 shows a 16-Mb S-DRAM in accordance with a second preferred embodiment of the present invention.

The previously mentioned paper by H. Yamauchi et al also discusses a technique called PCAR (parallel column access redundancy) to speed up column access when using a redundant circuit in a general-purpose DRAM. FIG. 15 shows an example of the PCAR applied to an S-DRAM with a great number of redundant circuits.

The FIG. 15 S-DRAM has the following: memory cell array/sense amplifier array (MSA) 100; data read amplifier (DRA) 110; output circuit 120; input circuit 130; precharge circuit 140 that operates on data write time; and write inhibit circuit (WIC) 150. Also shown in FIG. 15 are a row decoder 210, a column decoder 220, an address buffer 230, a column predecoder 240, a redundancy judging circuit (RJC) 250, a column redundant signal generator (CRSG) 260, a data bus switching signal generator (DBSSG) 270, and a clock generator 280. In view of a large storage capacity, column address is two-stage decoded by column predecoder 240 and column decoder 220. CLK/XCLK are a pair of complementary clock signals for synchronous operation and are generated by clock generator 280 from an external clock signal.

The FIG. 15 S-DRAM will now be described. Neither DRA 110, output circuit 120, input circuit 130, precharge circuit 140, nor WIC 150 is not described here, since they have already been explained by reference to FIG. 1.

MSA 100 is divided into 4 or more blocks. FIG. 15 shows in detail a hookup between two particular adjacent blocks. First normal memory cell array (NMCA) 71a, second NMCA 71b, first spare memory cell array (SMCA) 72a, and second SMCA 72b are shown in FIG. 15. One of the two adjacent blocks is made up of NMCA 71a and SMCA 72b, while the other block is made up of NMCA 71b and SMCA 72a. SMCA 72a contains spare memory cells kept in reserve for use when there is found a faulty memory cell in NMCA 71a. SMCA 72b, too, contains spare memory cells kept in reserve for use when there is found a faulty memory cell in NMCA 71b.

Sense amplifier array (SAA) 73a, composed of sense amplifiers, is provided for NMCA 71a, while SAA 74b, composed of sense amplifiers, is provided for SMCA 72b. Like FIG. 1, extending from two internal nodes of each sense amplifier of SAA 73a and SAA 74b are a pair of bit lines. Each pair of bit lines is connected to a pair of data lines (i.e., DQ/XDQ 75) via column switches 201, 201 formed by NMOS transistors. Note that, for convenience sake, these two column switches 201, 201 are represented in the form of a single schematic symbol for NMOS transistor. A single normal column-select line Y is connected to the gates of the NMOS transistors forming column switches 201, 201 associated with NMCA 71a. A single spare column-select line SY is connected to the gates of the NMOS transistors forming other column switches associated with SMCA 72b, which is not shown in the figure. DQ/XDQ 75 extend from MSA 100 and are connected with DRA 110 via data bus switches (DBSs) 203, 203. These two switches are represented in the form of a single schematic symbol for NMOS transistor.

SAA 73b, composed of sense amplifiers, is provided for NMCA 71b, while SAA 74a, composed of sense amplifiers, is provided for SMCA 72a. Extending from two internal nodes of each sense amplifier of SAA 73b and SAA 74a are a pair of bit lines. Each pair of bit lines is connected to a pair of data lines (i.e., DQ/XDQ 76) via column switches 202, 202 formed by NMOS transistors. For convenience sake, these two column switches are represented in the form of a single schematic symbol for NMOS transistor. A single spare column-select line SY is connected to the gates of the NMOS transistors forming column switches 202, 202 associated with SMCA 72a. A single normal column-select line Y is connected to the gates of the NMOS transistors forming other column switches associated with NMCA 71b, which is not shown in the figure. DQ/XDQ 76 extend from MSA 100 and are connected with DRA 110 via DBSs 204, 204. In the figure, these two switches are represented in the form of a single schematic symbol for NMOS transistor.

Row decoder 210 selects a single word line X, connected in common to NMCA 71a, NMCA 71b, SMCA 72a, and SMCA 72b, thereafter activating such a selected word line.

Address buffer 230 holds an input address and provides each of column predecoder 240, RJC 250, and DBSSG 270 with a column address signal, ADD.

In synchronism with clock signals CLK/XCLK, column predecoder 240 generates column predecode signals YPA and YPB from ADD and lathes these generated signals. These latched YPA and YPB are fed to column decoder 220.

RJC 250 generates, from ADD, redundancy judgement signals CNED/XCNED and column redundancy judgement signals RED. CNED/XCNED are a pair of complementary signals. If any one of spare addresses programmed into fuses matches a column address represented by ADD, then CNED and XCNED go HIGH and LOW, respectively. This situation is hereinafter referred to as the "redundant case". On the other hand, if there is no need to give relief to any memory cell in the normal memory cell arrays, or if there is found no matching in RJC 250, then CNED goes LOW whereas XCNED goes HIGH. This situation is hereinafter referred to as the "non-redundant case". RED is a general name given for N signals to signify a substitution cell column in accordance with the matching between the column address with the spare address. CNED/XCNED are fed to DBSSG 270. RED is fed to CRSG 260.

In synchronism with CLK/XCLK, CRSG 260 generates column redundant signals CSPE from RED and lathes these generated signals. Like RED, CSPE is a general name given for N signals to signify a substitution cell column. CSPE latched is supplied to column decoder 220.

Column decoder 220 selects a single normal column-select line Y in synchronism with CLK and on the basis of YPA and YPB, thereby activating such a selected line. Further, column decoder 220 selects a single spare column-select line SY in synchronism with CLK and on the basis of CSPE thereby activating such a selected line. In the non-redundant case in which every CSPE is LOW, only one normal column-select line Y is made active. In the redundant case in which there is a CSPE that is HIGH, one normal column-select line Y and one spare column-select line SY are made active at the same time.

In synchronism with CLK/XCLK, DBSSG 270 generates data bus switching signals SPY/XSPY from a particular one bit of ADD, and CNED/XCNED. SPY/XSPY are a pair of complementary signals. SPY is supplied to the gates of two NMOS transistors forming data bus switches 203, 203 provided on DQ/XDQ 75, while XSPY is supplied to the gates of two NMOS transistors forming data bus switches 204, 204 provided on DQ/XDQ 76.

Because of use of the PCAR technique, the FIG. 15 S-DRAM is able to provide a high-speed read rate. More specifically, while column predecoder 240 and column decoder 220 are decoding an input address to perform a selection among normal memory cells, RJC 250 makes a redundancy/non-redundancy judgement concurrently with such a decoding operation by column predecoder 240 and column decoder 220, and a spare memory cell is selected by CRSG 260 and column decoder 220. Therefore, reading data from a spare memory cell and reading data from a normal memory cell are carried out at the same high speed read rate.

Such is described in detail. In the redundant case, one normal column-select line Y and one spare column-select line SY are simultaneously made active. If a normal column-select line Y associated with NMCA 71a goes active, then column switches 201, 201 establish connections between a pair of bit lines of a sense amplifier in SAA 73a and DQ/XDQ 75. In response to activation of a spare column-select line SY associated with SMCA 72a, column switches 202, 202 establish connections between a pair of bit lines of a sense amplifier in SAA 74a and DQ/XDQ 76. DBSSG 270 turns on only a pair of data bus switches 204, 204 provided on DQ/XDQ 76. As a result, data, read out of SMCA 72a, is provided outside, via DRA 110 and output circuit 120.

In the redundant case where SMCA 72b works as a substitute for NMCA 71b, data of NMCA 71b is read onto DQ/XDQ 76 while data of SMCA 72b is read onto DQ/XDQ 75. In such a case, DBSSG 270 is designed in such a way as to turn on only a pair of data bus switches 203, 203 provided on DQ/XDQ 75.

Column predecoder 240, CRSG 260, column decoder 220, and DBSSG 270 are described in that order.

Figure 16:
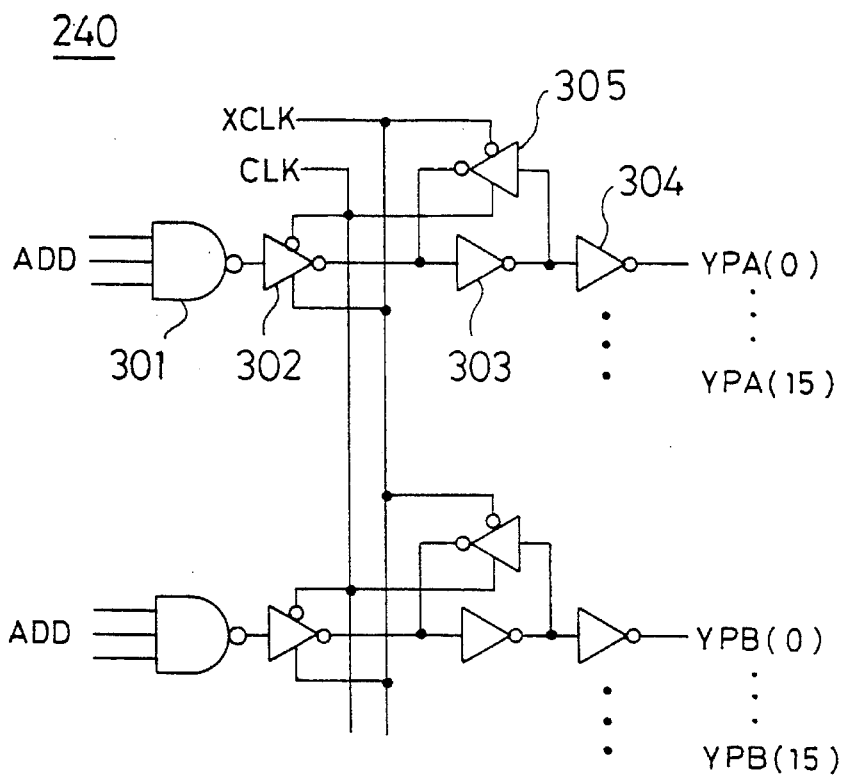
FIG. 16 is a circuit diagram showing the internal structure of a column predecoder of FIG. 15.

FIG. 16 shows column predecoder 240. Column predecoder 240 is made up of 32 unit circuits. Each unit circuit is formed by one NAND circuit 301, two clocked inverters 302 and 305, and two inverters 303 and 304. ADD from address buffer 230 is fed to NAND circuit 301 for predecoding. Inverter 303 and clocked inverter 305 are connected together in such a way as to form a latch circuit. CLK/XCLK are applied to the control terminals of clocked inverters 302 and 305 in such a way that one of clocked inverters 302 and 305 works as an inverter while the other clocked inverter stops functioning as an inverter. Inverter 304, provided on the output side, outputs one of column predecode signals YPA(0)-YPA(15) and YPB(0)-YPB(15).

Figure 17:
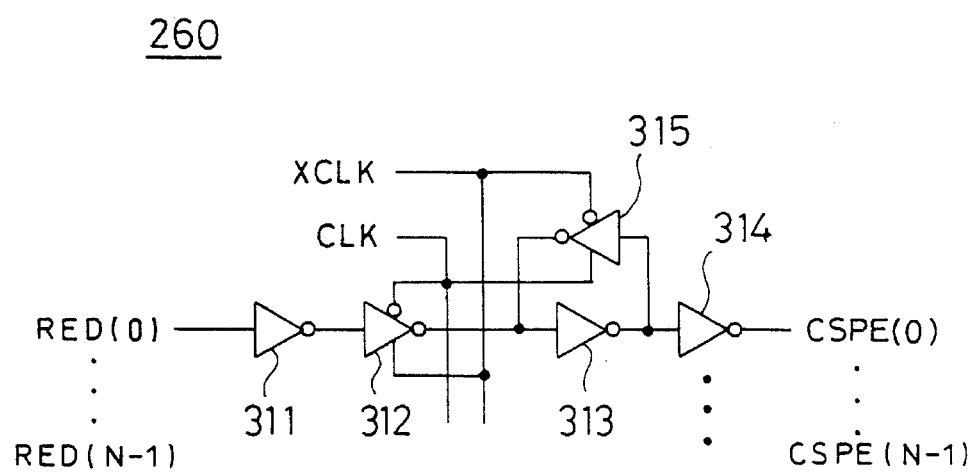
FIG. 17 is a circuit diagram showing the internal structure of a column redundant signal generator of FIG. 15.

FIG. 17 shows CRSG 260. CRSG 260 is made up of N unit circuits. Each unit circuit is formed by three inverters 311, 313, and 314 and two clocked inverters 312 and 315. Inverter 311, provided on the input side, receives one of column redundancy judgement signals RED(0)-RED(N-1). Inverter 313 and clocked inverter 315 are connected together in such a way as to form a latch circuit. CLK/XCLK are applied to the control terminals of clocked inverters 312 and 315 in such a way that one of clocked inverters 312 and 315 works as an inverter while the other clocked inverter stops functioning as an inverter. Inverter 314, provided on the output side, outputs one of column redundant signals CSPE(0)-CSPE(N-1).

Figure 18:
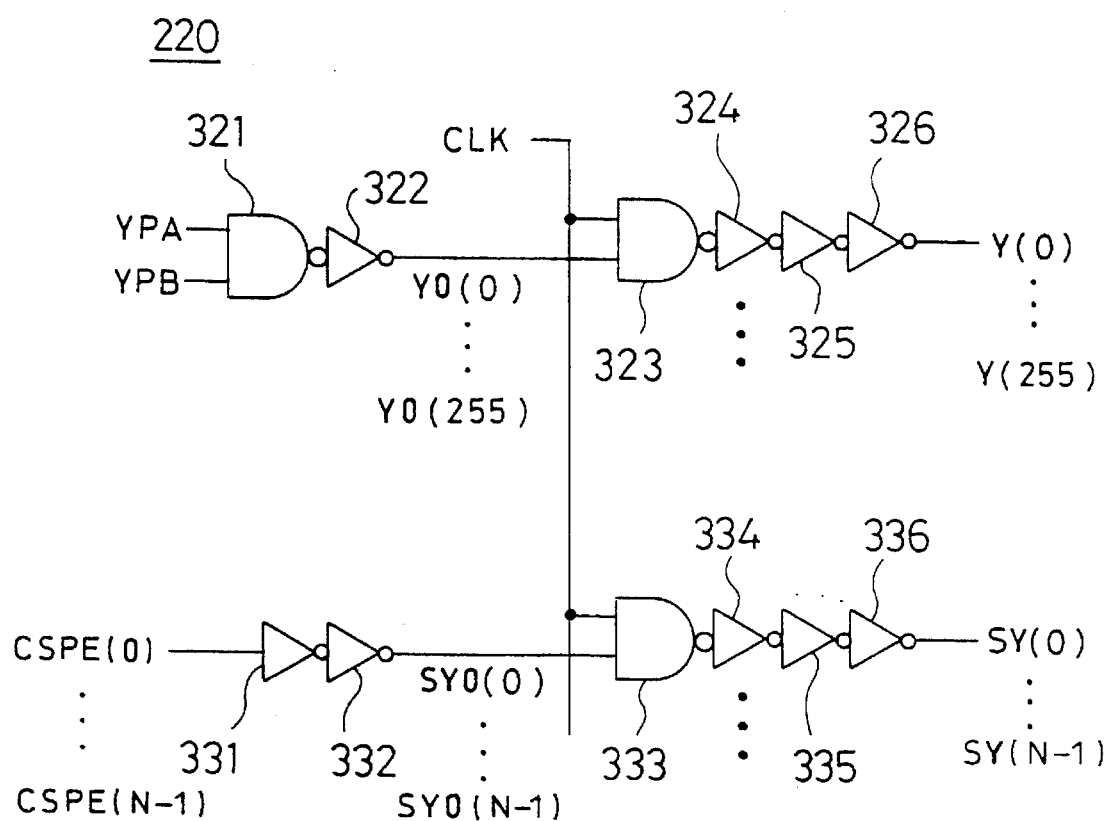
FIG. 18 is a circuit diagram showing the internal structure of a column decoder of FIG. 15.

FIG. 18 shows column decoder 220. Column decoder 220 is made up of 256 unit circuits of a first type and N unit circuits of a second type. Each first type unit circuit is formed by two NAND circuits 321 and 323 and four inverters 322, 324, 325, and 326. YPA and YPB from column predecoder 240 are fed to NAND circuit 321 for decoding. The output of NAND circuit 321 is fed, via inverter 322, to one of the input terminals of NAND circuit 323 as one of column decode signals YO(0)-YO(255). CLK is supplied to the other input terminal of NAND circuit 323. Inverter 326, provided on the output side, is one to make one of 256 normal column-select lines Y(0)-Y(255) active. On the other hand, each second type unit circuit is formed by one NAND circuit 333 and five inverters 331, 332, 334, 335, and 336. CSPE(0)-CSPE(N-1) from CRSG 260 are fed, via inverters 331 and 332, to one of the input terminals of NAND circuit 333 as respective spare signals SYO(0)-SYO(N-1). CLK is supplied to the other input terminal of NAND circuit 333. Inverter 336, provided on the output side, is one to make one of N spare column-select lines SY(0)-SY(N-1) active.

Figure 19:
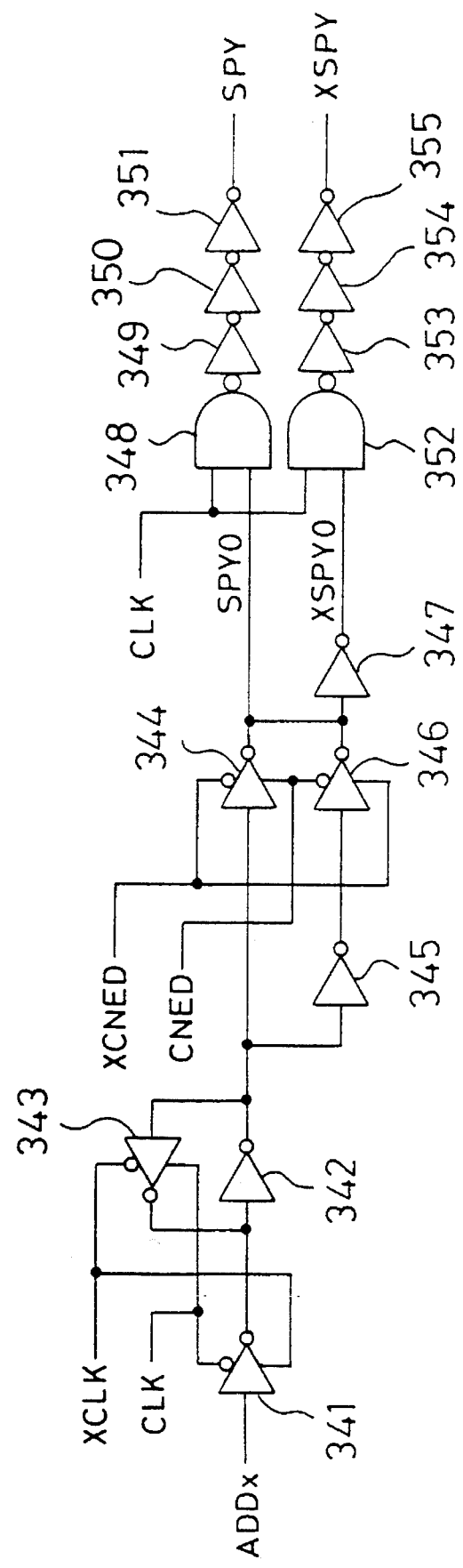
FIG. 19 is a circuit diagram showing the internal structure of a data bus switching signal generator of FIG. 15.

FIG. 19 shows DBSSG 270. DBSSG 270 is made up of four clocked inverters 341, 343, 344, and 346, nine inverters 342, 345, 347, 349–351, and 353–355, and two NAND circuits 348 and 352. Clocked inverter 341, provided on the input side, inputs a particular one bit (ADDx) of ADD from address buffer 230. ADDx is the least significant bit of upper bits of ADD for block selection. Inverter 342 and clocked inverter 343 are connected together in such a way as to form a latch circuit. CLK/XCLK are applied to the control terminals of clocked inverters 341 and 343 in such a way that one of clocked inverters 341 and 343 works as an inverter while the other clocked inverter stops functioning as an inverter. CNED/XCNED are applied to the control terminals of clocked inverters 344 and 346 in such a way that one of clocked inverters 344 and 346 works as an inverter while the other clocked inverter stops functioning as an inverter. The output of clocked inverter 344 or clocked inverter 346, whichever is selected, and an inverted signal thereof are fed to one of the input terminals of NAND circuit 348 and to one of the input terminals of NAND circuit 352 as redundant address signals SPY0/XSPY0. CLK is applied to the other input terminals of NAND circuits 348 and 352. Whereas inverter 351 outputs a data bus switching signal SPY, inverter 355 outputs a data bus switching signal XSPY.

FIGS. 20a–20e are signal waveform diagrams showing the operation of the FIG. 15 S-DRAM. By making reference to these signal waveform diagrams, the operation of read in the present S-DRAM will now be described.

In column predecoder 240 of FIG. 16, while CLK stays LOW and XCLK stays HIGH, clocked inverter 302 works as an inverter and clocked inverter 305 stops functioning as an inverter. As a result, inverted signals as a result of inverting the output of NAND circuit 301 are fed to column decoder 220 as YPA and YPB. Then, if CLK makes a LOW-to-HIGH transition and XCLK makes a HIGH-to-LOW transition, this allows inverter 303 and clocked inverter 305 to start working as a latch circuit, and at the same time clocked inverter 302 breaks a signal path connecting NAND circuit 301 and the latch circuit. At this stage, the latch circuit works to hold YPA and YPB when CLK stayed LOW (see FIG. 20a). Therefore, it is possible to make column decoder 220 operate without changing YPA and YPB as long as CLK is held HIGH and XCLK is held LOW, even if ADD varies. Next, if CLK makes a HIGH-to-LOW transition and XCLK makes a LOW-to-HIGH transition, this releases the latching of YPA and YPB, and at the same time communication between NAND circuit 01 and column decoder 220 is restored.

Also, in CRSG 260 of FIG. 17, while CLK stays LOW and XCLK stays HIGH, clocked inverter 312 works as an inverter and clocked inverter 315 stops functioning as an inverter. As a result, a non-inverted signal of RED is fed to column decoder 220 as a column redundant signal CSPE. Then, if CLK makes a LOW-to-HIGH transition and XCLK makes a HIGH-to-LOW transition, this allows inverter 313 and clocked inverter 315 to start working as a latch circuit, and at the same time clocked inverter 312 breaks a signal path connecting inverter 311 provided on the input side and the latch circuit. At this stage, the latch circuit works to hold CSPE when CLK stayed LOW (see FIG. 20a). Therefore, it is possible to make column decoder 220 work without changing CSPE as long as CLK is held HIGH and XCLK is held LOW, even if RED varies with ADD. Next, if CLK makes a HIGH-to-LOW transition and XCLK makes a LOW-to-HIGH transition, this releases the latching of CSPE and at the same time communication between inverter 311 on the input side and column decoder 220 is restored.

Figure 20:
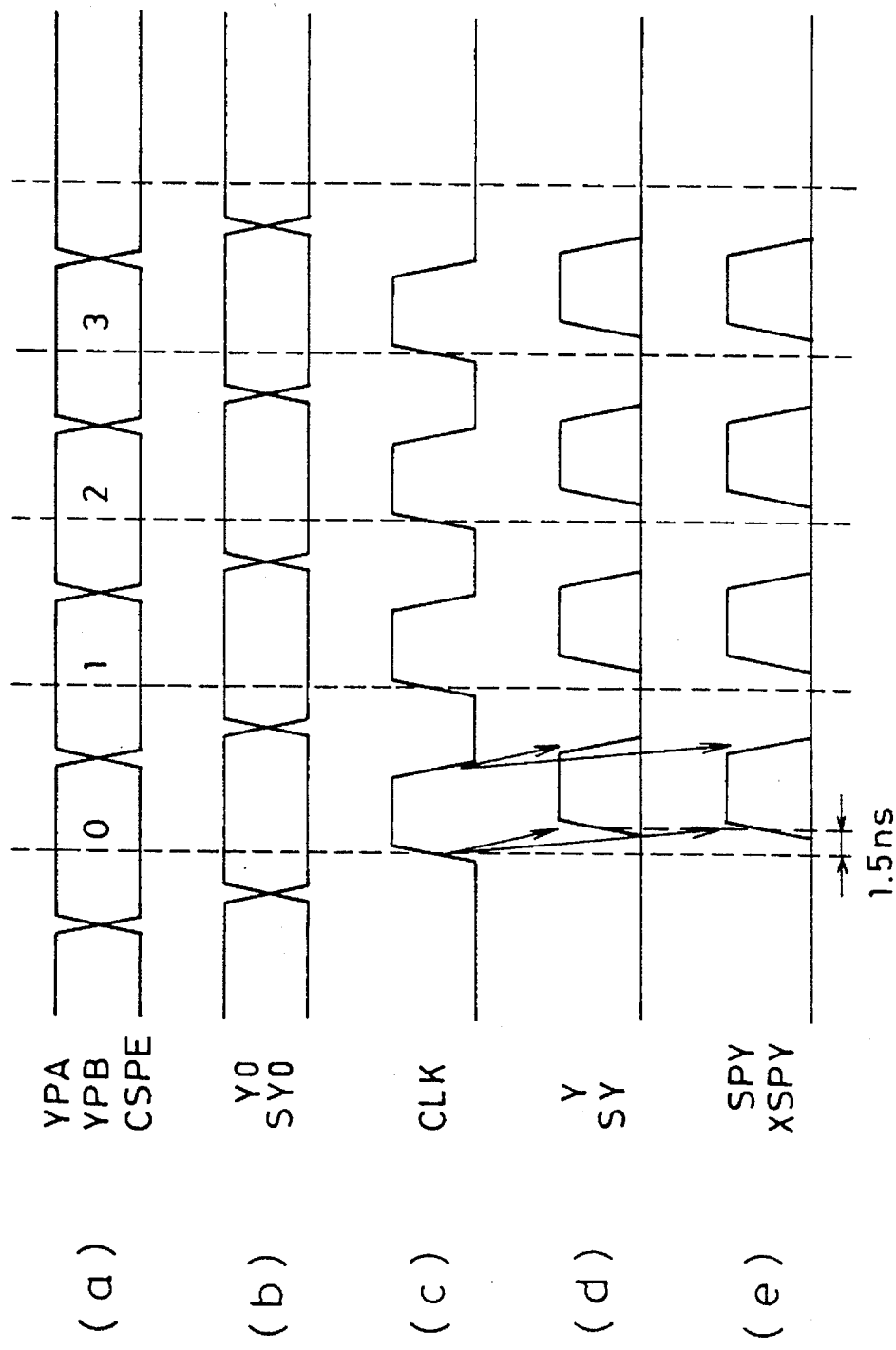
FIG. 20(a–e) is a signal waveform diagram showing the operation of the FIG. 15 S-DRAM.

In column decoder 220 of FIG. 18, a column decode signal YO, resulting from decoding YPA and YPB provided from column predecoder 240, is fed to one of the two input terminals of NAND circuit 323, while on the other hand a spare signal SYO based on CSPE provided from CRSG 260 is fed to one of the two input terminals of NAND circuit 333. CLK is fed to the other input terminals of NAND circuits 323 and 333. Therefore, as shown in FIG. 20d, in the redundant case, Y (the normal column-select line) and SY (the spare column-select line) are made active in synchronism with the rising-edge of CLK and they are then made inactive in synchronism with the subsequent falling-edge of CLK.

As described above, while CLK stays HIGH, neither YPA, YPB, nor CSPE is not allowed to make a transition because of the operation of the latch circuits in column predecoder 240 and CRSG 260. In other words, as shown in FIG. 20h, while CLK stays HIGH, neither YO nor SYO changes. Therefore, no malfunction will occur in activating Y and SY.

Figure 21A:
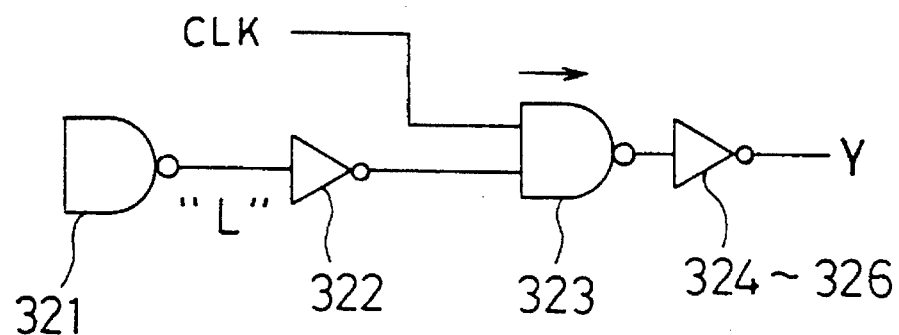
FIG. 21a is a circuit diagram showing the flow of signals in the FIG. 18 column decoder.
Figure 21B:
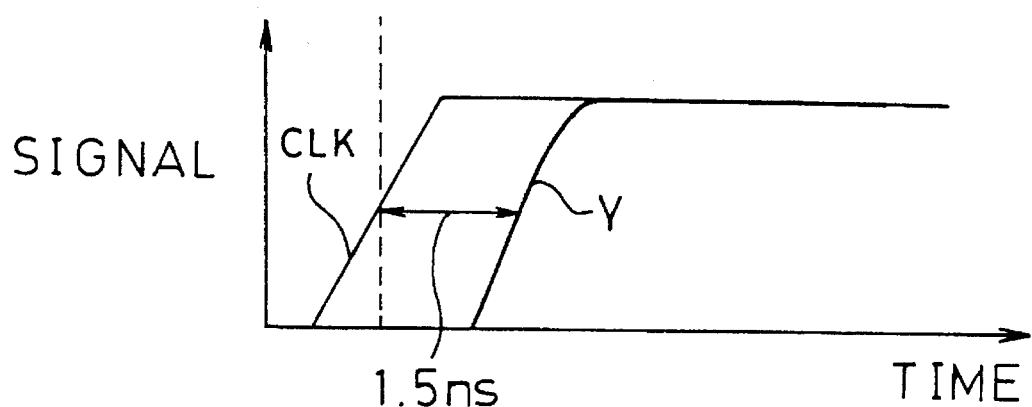
FIG. 21b is an associated signal waveform diagram.
Figure 22A:
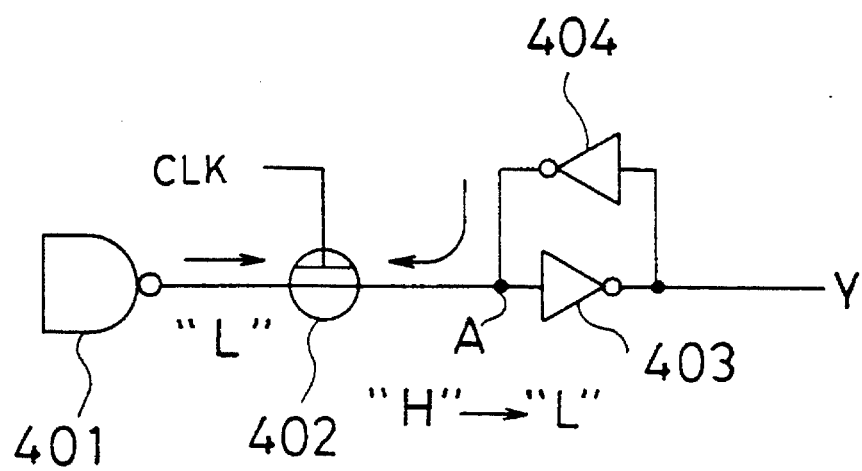
FIG. 22a is a circuit diagram showing the flow of signals in a column decoder of a conventional S-DRAM.
Figure 22B:
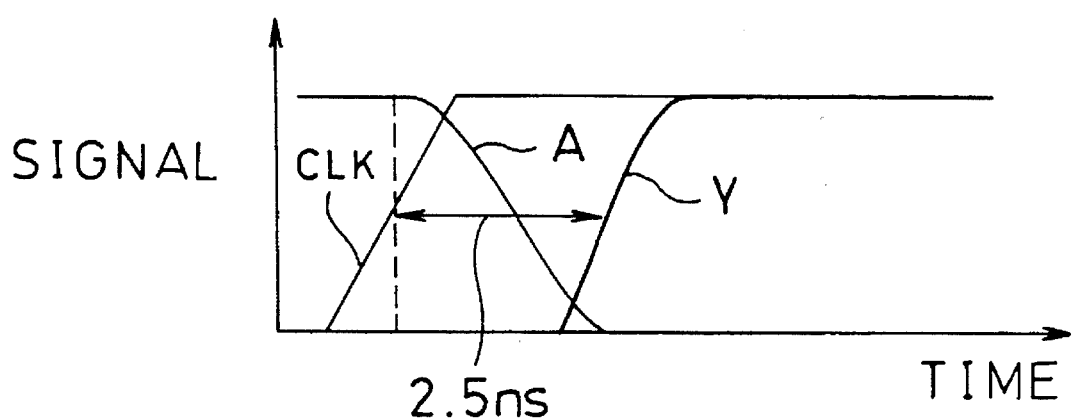
FIG. 22b is an associated signal waveform diagram.

FIG. 21a is a circuit diagram showing the flow of signals in a unit circuit of column decoder 220. FIG. 21b is a signal waveform diagram showing the process of activation of Y in the FIG. 21a circuit. As shown in FIG. 21b, at a 3.3 V power supply, Y is activated about 1.5 nanoseconds after CLK rises. Unlike conventional techniques, interference between signals can be avoided (see FIGS. 22a and 22b). This speeds up the rising of Y (SY), thereby providing high-speed read performance.

In accordance with column decoder 220 of FIG. 18, both the rise and fall transitions of CLK are utilized in NAND circuits 323 and 333. This eliminates the need for providing special circuitry used to make the last-selected Y and SY return to the inactive state.

Instead of employing a structure in which the logical product of YO and CLK is accomplished by means of NAND circuit 323, a different structure may be employed in which a signal representing a logical product of YPA and CLK, and YPB are fed to NAND circuit 321 for decoding.

In DBSSG 270 of FIG. 19, while CLK stays LOW and XCLK stays HIGH, of a pair of clocked inverters 341 and 343 the former works as an inverter while the latter stops working as an inverter. Therefore, a non-inverted signal of ADDx composed of one bit is fed to clocked inverter 344 and an inverted signal thereof is fed to clocked inverter 346. When CNED is HIGH, clocked inverter 344 functions as an inverter. Clocked inverter 346 functions as an inverter when CNED is LOW. Therefore, if HIGH=1 and LOW=0, this gives the following:

If ADDx=0 and CNED=0, then SPY0=0 (XSPY0=1);
If ADDx=0 and CNED=1, then SPY0=1 (XSPY0=0);
If ADDx=1 and CNED=0, then SPY0=1 (XSPY0=0); and
If ADDx=1 and CNED=1, then SPY0=0 (XSPY0=1).

As seen from the above, SPY0 is a signal representing the exclusive OR of ADDx and CNED, and XSPY0 is an inverted signal thereof. Next, when CLK makes a LOW-to-HIGH transition and XCLK makes a HIGH-to-LOW transition, this permits inverter 342 and clocked inverter 343 to start functioning as a latch circuit, and breaks, at the same time, an input signal path over which ADDx is fed to the latch circuit. This latch circuit works to hold SPY0/XSPY0 when CLK stayed LOW. Therefore, while CLK stays HIGH and XCLK stays LOW, even if ADD changes, SPY0/XSPY0 make no changes at all. Next, when CLK makes a HIGH-to-LOW transition and XCLK makes a LOW-to-HIGH transition, thereby cancelling the latching of SPY0/XSPY0 and, at the same time, restoring the disconnected input signal path.

Whereas SPY0 is fed to one of the two input terminals of NAND circuit 348, XSPY0 is fed to one of the two input terminals of NAND circuit 352. CLK is fed to the other input terminals of NAND circuits 348 and 352. Therefore, as shown in FIG. 20e, one of SPY/XSPY goes active or becomes HIGH in synchronism with the rising-edge of CLK and goes inactive or becomes LOW in synchronism with the subsequent falling-edge of CLK.

In the non-redundant case (CNED=0), if ADDx=1, then SPY=1 (XSPY=0) in order that a pair of data bus switches 203, 203 provided on DQ/XDQ 75 turn on. On the other hand, in the redundant case (CNED=1), if ADDx=1, then SPY=0 (XSPY =1) in order that a pair of data bus switches 204, 204 provided on DQ/XDQ 76 turn on. In such a case, read data from NMCA 71a or SMCA 72a is provided outside.

In the non-redundant case (CNED=0), if ADDx=0, then SPY=0 (XSPY=1) in order that data bus switches 204, 204 provided on DQ/XDQ 76 turn on. In the redundant case (CNED=1) on the other hand, if ADDx=0, then SPY=1 (XSPY=0) in order that data bus switches 203, 203 provided on DQ/XDQ 75 turn on. In such a case, read data from NMCA 71b or SMCA 72b is provided outside.

As previously described, while CLK stays HIGH, SPY0/XSPY0 are not allowed to make a transition because of the operation of the latch circuit in DBSSG 270. Therefore, no malfunction will occur in activating SPY0/XSPY0.

Like the normal column-select line Y and the spare column-select line SY, one of SPY/XSPY starts being activated about 1.5 nanoseconds after CLK rises, at a 3.3 V power supply (see FIG. 20e). In accordance with DBSSG 270, NAND circuits 348 and 352 are designed in such a way that SPY/XSPY automatically return to the inactive state in response to the falling of CLK.

Taking into account S-DRAM pipeline operation, clock signals to be fed to column predecoder 240 and CRSG 260 may be advanced by one cycle in phase with respect to clock signals to be fed to column decoder 220. Additionally, in DBSSG 270, clock signals to be fed to clocked inverters 341 and 343 may be advanced by one cycle in phase with respect to clock signals to be fed to NAND circuits 348 and 352.

The invention claimed is:

1. A differential transmission method of signals in a semiconductor memory device, said differential transmission method comprising:

a first step of voltage-equalizing a pair of complementary input signal lines while voltage-equalizing a pair of complementary output signal lines;

a second step of receiving data on said complementary input signal lines while continuously performing voltage equalization on said complementary output signal lines only;

a third step of establishing connections between said complementary input signal lines and said complementary output signal lines in order that said data on said complementary input signal lines are transmitted to said complementary output signal lines; and a fourth step of breaking said established connections between said complementary input signal lines and said complementary output signal lines so as to perform voltage equalization on said complementary input signal lines only while holding said data on said complementary output signal lines.

2. The differential transmission method of claim 1, further including:

a step of allowing states of said first to fourth steps to make respective transitions in synchronism with a common clock signal.

3. The differential transmission method of claim 1, further including the step of remaining in a state defined by said fourth step of claim 1 prior to repeating said first step.

4. A differential transmission circuit for performing within a semiconductor memory device pipeline operation whose single cycle time is composed of first to fourth periods, said differential transmission circuit comprising:

a first pair of complementary signal lines;

a first equalizing means for voltage-equalizing, only in said first and fourth periods, said first pair of complementary signal lines to a first voltage level;

a second pair of complementary signal lines;

a second equalizing means for voltage-equalizing, only in said first and second periods, said second pair of complementary signal lines to a second voltage level; and a first transmitting means for transmitting data on said first pair of complementary signal lines to said second pair of complementary signal lines in said third period and for holding said data on said second pair of complementary signal lines in said fourth period.

5. The differential transmission circuit of claim 4 wherein:

said first transmitting means includes:

(a) a first P-channel MOS (PMOS) transistor having a source connected to a power supply terminal, a drain, and a gate for receiving a first clock signal so as to turn on said first PMOS transistor in said third and fourth periods only;

(b) a second PMOS transistor having a gate, a source, and a drain;

(c) a third PMOS transistor having a gate, a source, and a drain;

said second PMOS transistor's gate being connected one of said first pair of complementary signal lines and said third PMOS transistor's gate being connected to the other of said first pair of complementary signal lines;

said second and third PMOS transistors' sources each being connected to said first PMOS transistor's drain;

said second PMOS transistor's drain being connected to one of said second pair of complementary signal lines and said third PMOS transistor's drain being connected to the other of said second pair of complementary signal lines;

(d) a first N-channel MOS (NMOS) transistor having a gate, a source, and a drain; and (e) a second NMOS transistor having a gate, a source, and a drain;

said first NMOS transistor's gate being connected to one of said second pair of complementary signal lines and said second NMOS transistor's gate being connected to the other of said second pair of complementary signal lines;

said first and second NMOS transistors' sources each being connected to a ground terminal;

said first NMOS transistor's drain being connected to one of said second pair of complementary signal lines that is not connected to said first NMOS transistor's gate and said second NMOS transistor's drain being connected to the other of said second pair of complementary signal lines that is not connected to said second NMOS transistor's gate.

6. The differential transmission circuit of claim 5 wherein:

said first transmitting means further includes:

a fourth PMOS transistor Having a source connected to said power supply terminal, a drain, and a gate for receiving a second clock signal so as to turn on said fourth PMOS transistor in said third and fourth periods only;

a fifth PMOS transistor having a gate, a source, and a drain;

a sixth PMOS transistor having a gate, a source, and a drain;

said fifth PMOS transistor's gate being connected to one of said second pair of complementary signal lines and said sixth PMOS transistor's gate being connected to the other of said second pair of complementary signal lines;

said fifth and sixth PMOS transistors' sources each being connected to said fourth PMOS transistor's drain;

said fifth PMOS transistor's drain being connected to one of said second pair of complementary signal lines that is not connected to said fifth PMOS transistor's gate and said sixth PMOS transistor's drain being connected to the other of said second pair of complementary signal lines that is not connected to said sixth PMOS transistor's gate.

7. The differential transmission circuit of claim 4 wherein:

said first equalizing means has a set of PMOS transistors, said each PMOS transistor having a gate for receiving a third clock signal so as to voltage-equalize, only in said first and fourth periods, said first pair of complementary signal lines to a power supply voltage level.

8. The differential transmission circuit of claim 4 wherein:

said second equalizing means has a set of NMOS transistors, said each NMOS transistor having a gate for receiving a fourth clock signal so as to voltage-equalize, only in said first and second periods, said second pair of complementary signal lines to a ground voltage level.

9. The differential transmission circuit of claim 4 further comprising:

a third pair of complementary signal lines;

a third equalizing means for voltage-equalizing, only in said first and second periods, said third pair of complementary signal lines to said first voltage level; and a second transmitting means for transmitting said data on said second pair of complementary signal lines to said third pair of complementary signal lines in said third period and for holding said data on said third pair of complementary signal lines in said fourth period.

10. The differential transmission circuit of claim 9 wherein:

said second transmitting means includes:

(a) a third NMOS transistor having a gate, a source, and a drain;

(b) a fourth NMOS transistor having a gate, a source, and a drain;

said third NMOS transistor's gate being connected one of said second pair of complementary signal lines and said fourth NMOS transistor's gate being connected to the other of said second pair of complementary signal lines;

said third and fourth NMOS transistors' sources each being connected to a ground terminal;

said third NMOS transistor's drain being connected to one of said third pair of complementary signal lines and said fourth NMOS transistor's drain being connected to the other of said third pair of complementary signal lines;

(c) a seventh PMOS transistor having a gate, a source, and a drain;

(d) an eighth PMOS transistor having a gate, a source, and a drain;

said seventh PMOS transistor's gate being connected to one of said third pair of complementary signal lines and said eighth PMOS transistor's gate being connected to the other of said second pair of complementary signal lines;

said seventh and eighth PMOS transistors' sources each being connected to a power supply terminal;

said seventh PMOS transistor's drain being connected to one of said third pair of complementary signal lines that is not connected to said seventh PMOS transistor's gate and said eighth PMOS transistor's drain being connected to the other of said third pair of complementary signal lines that is not connected to said eighth PMOS transistor's gate.

11. The differential transmission circuit of claim 9 wherein:

said third equalizing means has a set of PMOS transistors, said each PMOS transistor having a gate for receiving a fifth clock signal so as to voltage-equalize, only in said first and second periods, said third pair of complementary signal lines to a power supply voltage level.

12. A semiconductor memory device comprising:

a data read means having a differential transmission circuit of claim 4 including, as the aforesaid first pair of complementary signal lines, a pair of complementary data lines used in transmitting data read out of a sense amplifier via a pair of column switches each made up of NMOS transistors; and a fourth equalizing means for voltage-equalizing said pair of complementary data lines prior to a supply of write data to said sense amplifier via said pair of complementary data lines and said pair of column switches;

said first equalizing means of said data read means voltage-equalizing said pair of complementary data lines to a power supply voltage level;

said fourth equalizing means voltage-equalizing said pair of complementary data lines to a ground voltage level.

13. The semiconductor memory device of claim 12 further comprising:

a write inhibit means for setting, in response to a write inhibit signal, voltages of a pair of complementary signal lines forming a data write bus connected to said pair of complementary data lines in order that said voltages of said pair of complementary data lines are set to a power supply voltage level in response to said write inhibit signal.

14. A semiconductor memory device comprising:

a data read means having a differential transmission circuit of claim 4 including, as the aforesaid first pair of complementary signal lines, a pair of complementary data lines used in transmitting data read out of a sense amplifier via a pair of column switches each made up of NMOS transistors; and a fourth equalizing means for voltage-equalizing said pair of complementary data lines prior to a supply of write data to said sense amplifier via said pair of complementary data lines and said pair of column switches;

said first equalizing means of said data read means and said fourth equalizing means each voltage-equalizing said pair of complementary data lines to a power supply voltage level.

15. A semiconductor memory device comprising:

a sense amplifier;

a pair of column switches each made up of NMOS transistors;

a pair of complementary data lines;

a read/equalizing means for voltage-equalizing said pair of complementary data lines to a power supply voltage level before data is read out of said sense amplifier via said pair of column switches and said pair of complementary data lines; and a write/equalizing means for voltage-equalizing said pair of complementary data lines to a ground voltage level prior to a supply of write data to said sense amplifier via said pair of complementary data lines and said pair of column switches.

16. The semiconductor memory device of claim 15 further comprising:

a write inhibit means for setting, in response to a write inhibit signal, voltages of a pair of complementary signal lines forming a data write bus connected to said pair of complementary data lines in order that said voltages of said pair of complementary data lines are set to a power supply voltage level in response to said write inhibit signal.

17. A semiconductor memory device comprising:

a sense amplifier;

a pair of column switches each made up of NMOS transistors;

a pair of complementary data lines for transmitting data to be written into said sense amplifier via said pair of column switches; and a write inhibit means for setting, in response to a write inhibit signal, voltages of a pair of complementary signal lines forming a data write bus connected to said pair of complementary data lines in order that said voltages of said pair of complementary data lines are set to a power supply voltage level in response to said write inhibit signal.

18. A semiconductor memory device capable of performing consecutive data read operation in synchronism with a clock signal, said semiconductor memory device comprising:

a switching means provided on a signal path between a sense amplifier and a data read amplifier; and an activating means for activating a control signal for on-off controlling said switching means in synchronism with one of recurring rise and fall transitions of said clock signal and for inactivating said control signal in synchronism with the other transition of said clock signal.

19. The semiconductor memory device of claim 18 wherein:

said activating means includes an AND means for providing a signal representing a logical product of an input signal and said clock signal as a control signal for on-off controlling said switching means.

20. The semiconductor memory device of claim 19 further comprising:

a latching means for latching an input signal of said AND means while said AND means is activating said signal for on-off controlling said switching means.

21. The semiconductor memory device of claim 20 further comprising:

an input disconnecting means for disconnecting said latching means from an input signal path thereof while said latching means is latching an input signal of said AND means.

22. The semiconductor memory device of claim 18 wherein:

said switching means includes a column switch for supplying data from a sense amplifier connected to a normal memory cell, to said data read amplifier.

23. The semiconductor memory device of claim 22 wherein:

said activating means includes an AND circuit for providing a signal representing a logical product of a column decode signal and said clock signal as a control signal for on-off controlling said column switch.

24. The semiconductor memory device of claim 18 wherein:

said switching means includes a column switch for supplying data from a sense amplifier connected to a spare memory cell, to said data read amplifier.

25. The semiconductor memory device of claim 24 wherein:

said activating means includes an AND circuit for providing a signal representing a logical product of a column redundant signal and said clock signal as a control signal for on-off controlling said column switch.

26. The semiconductor memory device of claim 18 wherein:

said switching means includes a data bus switch for selecting between a data bus for data from a sense amplifier connected to a normal memory cell and a data bus for data from a sense amplifier connected to a spare memory cell, to supply data on a selected bus to said data read amplifier.

27. The semiconductor memory device of claim 26 wherein:

said activating means includes an AND circuit for providing a signal representing a logical product of a redundant address signal and said clock signal as a control signal for on-off controlling said data bus switch.

28. A semiconductor memory device capable of consecutive data read operation in synchronism with a clock signal, said semiconductor memory device comprising:

a switching means provided on a signal path between a sense amplifier and a data read amplifier;

an AND means for providing a signal representing a logical product of an input signal and said clock signal as a control signal for on-off controlling said switching means in order that said signal for on-off controlling said switching means is made active in synchronism with one of recurring rise and fall transitions of said clock signal and is made inactive in synchronism with the other transition of said clock signal;

a latching means for latching an input signal of said AND means while said AND means is activating said signal for on-off controlling said switching means; and an input disconnecting means for disconnecting said latching means from an input signal path thereof while said latching means is latching an input signal of said AND means.

* * * * *